(12) United States Patent
Buskirk et al.

(10) Patent No.: US 11,794,476 B2
(45) Date of Patent: Oct. 24, 2023

(54) MICRO-VALVES FOR USE IN JETTING ASSEMBLIES

(71) Applicant: Matthews International Corporation, Pittsburgh, PA (US)

(72) Inventors: William A. Buskirk, Albany, OR (US); Steven E. Flego, Portland, OR (US); Charles C. Haluzak, Philomath, OR (US); John Whitlock, Pittsburgh, PA (US); Eric R. Miller, Seattle, WA (US); Glenn J. T. Leighton, South Yorkshire (GB)

(73) Assignee: Matthews International Corporation, Pittsburgh, PA (US)

( * ) Notice: Subject to any disclaimer, the term of this patent is extended or adjusted under 35 U.S.C. 154(b) by 1081 days.

(21) Appl. No.: 16/407,452

(22) Filed: May 9, 2019

(65) Prior Publication Data
US 2019/0346066 A1    Nov. 14, 2019

Related U.S. Application Data

(60) Provisional application No. 62/670,279, filed on May 11, 2018.

(51) Int. Cl.
  *B41J 2/14*      (2006.01)
  *F16K 99/00*     (2006.01)
  *H10N 30/20*     (2023.01)

(52) U.S. Cl.
  CPC ....... *B41J 2/14282* (2013.01); *B41J 2/14201* (2013.01); *B41J 2002/14491* (2013.01); (Continued)

(58) Field of Classification Search
  CPC ................ B41J 2/14282; B41J 2/14201; B41J 2002/14491; B41J 2202/05; B41J 2202/18;
  (Continued)

(56) References Cited

U.S. PATENT DOCUMENTS

| 4,072,959 A | 2/1978 | Elmqvist |
| 4,340,083 A | 7/1982 | Cummins |

(Continued)

FOREIGN PATENT DOCUMENTS

| CN | 201022022 Y | 2/2008 |
| CN | 101386236 A | 3/2009 |

(Continued)

OTHER PUBLICATIONS

International Search Report and Written Opinion for International Application No. PCT/IB2019/053837, dated Aug. 28, 2019, 11 pages.

(Continued)

*Primary Examiner* — Geoffrey S Mruk
(74) *Attorney, Agent, or Firm* — DLA Piper LLP

(57) ABSTRACT

A micro-valve includes an orifice plate including a first surface and a second surface, and an orifice extending from the first surface to the second surface. The micro-valve also includes a spacing member disposed on the first surface and offset from the orifice, a valve seat disposed on the first surface. The valve seat defines an opening in fluid communication with the orifice in a flow direction. The micro-valve also includes an actuating beam disposed on the spacing member extending from the spacing member toward the orifice, the actuating beam being moveable between an open position and a closed position. The micro-valve also includes a sealing member affixed to an end portion of the actuating beam. In a closed position, a sealing surface of the sealing member contacts the valve seat to close the micro-valve.

20 Claims, 18 Drawing Sheets

(52) U.S. Cl.
CPC ........ *B41J 2202/05* (2013.01); *B41J 2202/18* (2013.01); *F16K 99/0048* (2013.01); *F16K 2099/0092* (2013.01); *H10N 30/2042* (2023.02)

(58) Field of Classification Search
CPC ........ F16K 99/0048; F16K 2099/0092; H01L 41/094
See application file for complete search history.

(56) References Cited

U.S. PATENT DOCUMENTS

| | | | |
|---|---|---|---|
| 4,409,601 A | 10/1983 | Nilsson et al. | |
| 4,450,375 A | 5/1984 | Siegal | |
| 4,564,846 A | 1/1986 | Siegal | |
| 4,629,926 A | 12/1986 | Siegal | |
| 4,758,226 A | 7/1988 | Carre | |
| 4,809,017 A | 2/1989 | Fost | |
| 4,962,391 A | 10/1990 | Kitahara et al. | |
| 5,079,472 A | 1/1992 | Uhl et al. | |
| 5,126,755 A | 6/1992 | Sharpe et al. | |
| 5,343,894 A | 9/1994 | Frisch et al. | |
| 5,441,597 A | 8/1995 | Bonne et al. | |
| 5,452,878 A | 9/1995 | Gravesen et al. | |
| 5,619,177 A | 4/1997 | Johnson et al. | |
| 5,784,083 A | 7/1998 | Schumann et al. | |
| 5,810,325 A | 9/1998 | Carr | |
| 5,857,491 A | 1/1999 | Cooke | |
| 5,901,939 A | 5/1999 | Cabuz et al. | |
| 6,024,340 A | 2/2000 | Lazarus et al. | |
| 6,116,517 A | 9/2000 | Heinzl et al. | |
| 6,142,444 A | 11/2000 | Kluge | |
| 6,164,621 A | 12/2000 | Bouchard et al. | |
| 6,352,337 B1 | 3/2002 | Sharma | |
| 6,367,767 B2 | 4/2002 | Weinmann et al. | |
| 6,412,913 B1 | 7/2002 | Moon et al. | |
| 6,450,204 B2 | 9/2002 | Itzhaky | |
| 6,460,979 B1 | 10/2002 | Heinzl et al. | |
| 6,464,341 B1 | 10/2002 | Furlani et al. | |
| 6,581,638 B2 | 6/2003 | Frisch et al. | |
| 6,590,267 B1 | 7/2003 | Goodwin-Johanssen et al. | |
| 6,676,249 B2 | 1/2004 | Lebens | |
| 6,811,136 B2 | 11/2004 | Eberhardt et al. | |
| 6,959,911 B2 | 11/2005 | Strasser et al. | |
| 6,988,706 B2 | 1/2006 | Seeley et al. | |
| 6,991,214 B2 | 1/2006 | Richter | |
| 7,159,841 B2 | 1/2007 | Gemmen et al. | |
| 7,299,818 B2 | 11/2007 | Pinter et al. | |
| 7,322,376 B2 | 1/2008 | Frisch | |
| 7,448,412 B2 | 11/2008 | Teach et al. | |
| 7,540,592 B2 | 6/2009 | Silverbrook | |
| 9,975,347 B2 | 5/2018 | Tozuka et al. | |
| 10,155,385 B2 | 12/2018 | Hiramoto et al. | |
| 2003/0030705 A1 | 2/2003 | Koike et al. | |
| 2003/0076649 A1 | 4/2003 | Speakman | |
| 2003/0222236 A1 | 12/2003 | Eberhardt et al. | |
| 2003/0234835 A1 | 12/2003 | Torii et al. | |
| 2004/0137300 A1 | 7/2004 | Gemmen et al. | |
| 2005/0133751 A1 | 6/2005 | Seeley et al. | |
| 2005/0002591 A1 | 11/2005 | Wong et al. | |
| 2006/0092237 A1 | 5/2006 | Kwon et al. | |
| 2006/0209137 A1 | 9/2006 | Kojima et al. | |
| 2006/0255064 A1 | 11/2006 | Donaldson | |
| 2010/0141709 A1 | 6/2010 | DeBrabander et al. | |
| 2010/0321448 A1 | 12/2010 | Buestgens et al. | |
| 2011/0073188 A1 | 3/2011 | Marcus et al. | |
| 2011/0073788 A1 | 3/2011 | Marcus et al. | |
| 2012/0268529 A1 | 10/2012 | Baumer et al. | |
| 2014/0333703 A1* | 11/2014 | Buskirk ............... B41J 2/14282 347/85 |
| 2016/0189494 A1 | 6/2016 | Levesque et al. | |
| 2017/0274658 A1 | 9/2017 | Terasaki | |
| 2018/0056288 A1 | 3/2018 | Abate et al. | |
| 2018/0147848 A1 | 5/2018 | Teranishi et al. | |
| 2018/0162140 A1 | 6/2018 | Buskirk et al. | |
| 2018/0361747 A1 | 12/2018 | Yaginuma et al. | |
| 2018/0370230 A1 | 12/2018 | Nakagawa et al. | |
| 2019/0086793 A1 | 3/2019 | Lyons et al. | |
| 2019/0344564 A1 | 11/2019 | Buskirk et al. | |
| 2019/0344568 A1 | 11/2019 | Buskirk et al. | |
| 2019/0346051 A1 | 11/2019 | Buskirk et al. | |
| 2019/0346067 A1 | 11/2019 | Buskirk et al. | |
| 2021/0129173 A1 | 5/2021 | Buskirk et al. | |

FOREIGN PATENT DOCUMENTS

| | | |
|---|---|---|
| DE | 3608550 A1 | 9/1987 |
| DE | 10133939 A1 | 1/2003 |
| DE | 10 2004 035 844 B3 | 10/2005 |
| DE | 10 2007 034 049 B3 | 6/2008 |
| EP | 0 170 990 A1 | 2/1986 |
| EP | 0941434 A1 | 9/1999 |
| EP | 1 104 863 A2 | 6/2001 |
| EP | 2 017 511 A1 | 1/2009 |
| EP | 3187337 A1 | 7/2017 |
| JP | 57-178767 A | 11/1982 |
| JP | 57-197176 A | 12/1982 |
| JP | S63-185471 A | 8/1988 |
| JP | S64-18643 A | 1/1989 |
| JP | 02033979 | 2/1990 |
| JP | 02273242 | 11/1990 |
| JP | 09-011471 A | 1/1997 |
| JP | 2819141 A | 10/1998 |
| JP | H11-105274 | 4/1999 |
| JP | 2000-296619 A | 10/2000 |
| JP | 2002532658 A | 10/2002 |
| JP | 2004-308554 A | 11/2004 |
| JP | 2009243911 A | 10/2009 |
| JP | 2012507417 A | 3/2012 |
| JP | 2012241824 A | 12/2012 |
| JP | 05116284 | 1/2013 |
| JP | 2013-533817 A | 8/2013 |
| JP | 2016132188 A | 7/2016 |
| JP | 2016132189 A | 7/2016 |
| JP | 2016525658 A | 8/2016 |
| WO | 1986005722 A1 | 10/1986 |
| WO | 2000038928 A1 | 7/2000 |
| WO | 2001074592 A1 | 10/2001 |
| WO | WO-02/37661 A1 | 5/2002 |
| WO | WO-2009/010117 A1 | 1/2009 |
| WO | WO-2010/144343 A3 | 12/2010 |
| WO | WO-2012/002942 A1 | 1/2012 |
| WO | 2019215671 A1 | 11/2014 |
| WO | WO-2014/182984 A1 | 11/2014 |
| WO | 2016030566 A1 | 3/2016 |
| WO | 2019215668 A1 | 11/2019 |
| WO | 2019215669 A1 | 11/2019 |
| WO | 2019215672 A1 | 11/2019 |
| WO | 2019215674 A1 | 11/2019 |
| WO | 2021087218 A1 | 5/2021 |

OTHER PUBLICATIONS

International Search Report and Written Opinion for PCT/US2014/037422 dated Sep. 3, 2014.

Supplementary European Search Report and Written Opinion for EP14795127 dated Jun. 8, 2018.

Xiaoting et al. "Vibration Energy Harvesting Using Piezoelectric Unimorph Cantilevers With Unequal Piezoelectric and Nonpiezoelectric Lengths" Dec. 2010, Applied Physics Letters 97:233503 (PubMed, DOI: 10.1063/1.3521389, retrieved from the internet Aug. 30, 2020).

\* cited by examiner

MICRO-VALVES FOR USE IN JETTING ASSEMBLIES

CROSS-REFERENCE TO RELATED APPLICATIONS

The present application claims priority to and benefit of U.S. Provisional Application No. 62/670,279 filed May 11, 2018, the disclosure of which is hereby incorporated by reference herein in its entirety.

TECHNICAL FIELD

The present disclosure relates generally to the field of micro-valves fabricated using micro-electro-mechanical systems (MEMS) techniques. More specifically, the present disclosure relates to a jetting assembly including micro-valves that are used for industrial marking and coding.

BACKGROUND

Conventional printing technologies have several shortcomings. For example, continuous inkjet printers have certain deficiencies that are difficult to eliminate. The process of generating droplets from an ink supply, for example, may lead to ink dripping in an undesired direction (e.g., away from a target), leading to maintenance requirements. Additionally, makeup fluid is lost over time as a result of evaporation, requiring continuous replenishment. Other maintenance costs, such as repairing orifice plates due to degradation, are also required.

SUMMARY

One embodiment is directed to a micro-valve. The micro-valve includes an orifice plate including a first surface and a second surface, and an orifice extending from the first surface to the second surface. The micro-valve also includes a spacing member disposed on the first surface and offset from the orifice, a valve seat disposed on the first surface. The valve seat defines an opening in fluid communication with the orifice and a fluid plenum. The micro-valve also includes an actuating beam disposed on the spacing member extending from the spacing member toward the orifice. The actuating beam comprises a layer of piezoelectric material and is movable between a closed position and an open position by applying an electrical signal to the layer of piezoelectric material. The micro-valve also includes a sealing member affixed to an end portion of the actuating beam. When the layer of piezoelectric material does not have an electrical signal applied thereto, the actuating beam is in the closed position and a sealing surface of the sealing member contacts the valve seat to close the micro-valve.

Another embodiment is directed to a jetting assembly. The jetting assembly includes a valve body including an orifice plate including a plurality of orifices extending therethrough and a plurality of micro-valves. Each of the micro-valves includes a spacing member disposed on the orifice plate on a first side of a corresponding orifice of the plurality of orifices. An edge of the spacing member is spaced from a boundary of the corresponding orifice by a distance in a first direction. Each of the micro-valves also includes a valve seat disposed around the corresponding orifice. The corresponding orifice and an opening defined by the valve seat define a fluid outlet. Each of the micro-valves include an actuating beam disposed on the spacing member, the actuating beam extending at least the distance in the first direction from the spacing member such that an overlapping portion thereof overlaps with the fluid outlet. The actuating beam includes a layer of piezoelectric material and an electrical connection portion. Each of the micro-valves also includes a sealing member affixed to the overlapping portion, the sealing member extending from the overlapping portion toward the valve seat such that an outer surface thereof contacts the valve seat when the actuating beam is in a default state to close the micro-valve. The jetting assembly also includes a fluid manifold coupled to at least a portion of the plurality of micro-valves to define at least one fluid plenum, each of the at least one fluid plenum corresponding to at least a portion of the plurality of micro-valves. The jetting assembly also includes an interposer disposed on the fluid manifold. The interposer has a greater rigidity than the orifice plate to prevent bowing of the orifice plate.

Still another embodiment is directed towards a micro-valve for use in a jetting assembly. The micro-valve comprises an orifice plate including a first surface and a second surface. The orifice plate comprises an orifice extending from the first surface to the second surface. A spacing member is disposed on the first surface, the spacing member offset from the orifice. An actuating beam is disposed on the spacing member. The actuating beam extends from the spacing member toward the orifice. The actuating beam comprises a layer of piezoelectric material. The actuating beam is movable between a closed position and an open position by applying an electrical signal to the layer of piezoelectric material. A sealing member is affixed to an end portion of the actuating beam. When the layer of piezoelectric material does not have an electrical signal applied thereto, the actuating beam is in the closed position and a sealing surface of the sealing member contacts a rim of the orifice to close the micro-valve.

BRIEF DESCRIPTION OF THE DRAWINGS

The disclosure will become more fully understood from the following detailed description, taken in conjunction with the accompanying figures, in which.

DETAILED DESCRIPTION

Figure 1:
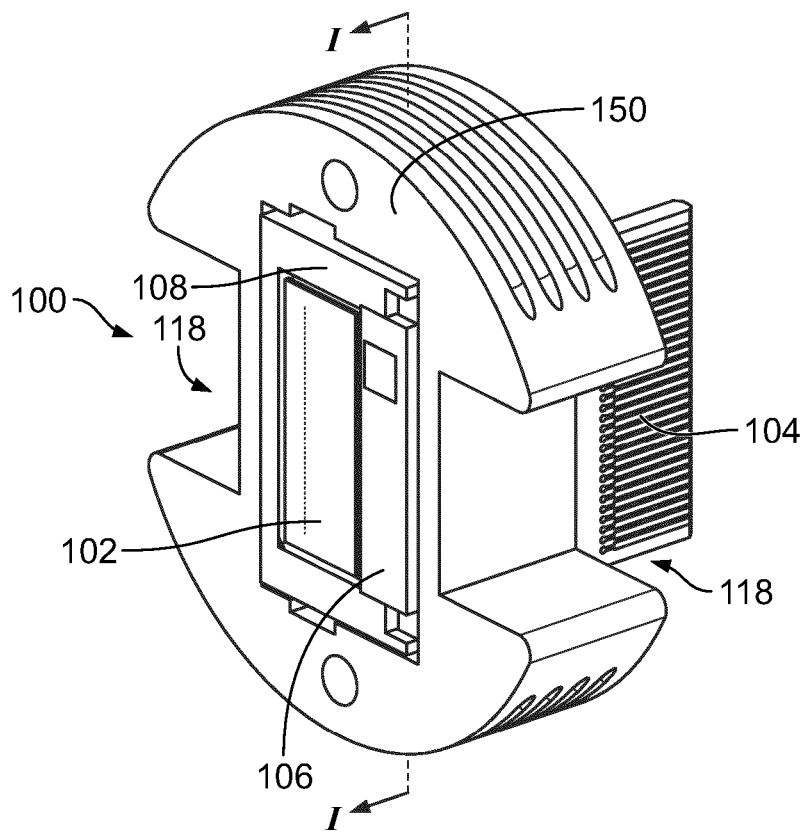
FIG. 1 is a perspective of a jetting assembly disposed in a holder, according to an example embodiment.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Referring generally to the figures, described herein is a jetting assembly including multiple micro-valves. The micro-valves described herein employ an actuating beam having a sealing member disposed thereon. The utilization of such an actuating beam enables tailoring the micro-valve to eliminate or reduce various deficiencies associated with conventional technologies including continuous inkjet jetting assemblies. For example, in various embodiments, the micro-valve includes a spacing member disposed between the actuating beam and an orifice plate. The spacing member maintains a spacing of a first end of the actuating beam and an orifice within the orifice plate so as to prevent squeeze film damping of the actuating beam. The actuating beam extends over the orifice from the spacing member and a sealing member extends towards the orifice to contact a valve seat which may be disposed at the periphery of the orifice or a rim of the orifice. Thus, without application of any electrical energy to the actuating beam, the sealing member seals off the orifice. In other words, the default position of the actuating beam (e.g., configured by careful selection of the materials contained therein) is that the micro-valve is closed. As such, fluid (e.g., ink, solvent, etc.) disposed in the micro-valve is sealed off from the external environment of the jetting assembly. This eliminates evaporation of the fluid, which reduces clogs. Additionally, the limited evaporation enables faster-drying ink to be used, which allows for printing at higher speeds than conventional systems.

To ensure proper sealing of the micro-valve described herein, a compatible relationship between the sealing member disposed on the actuating beam and the valve seat is maintained. The maintenance of such a relationship involves adjusting a number of factors pertaining to the jetting assembly's construction. In one aspect, steps are taken to ensure proper dimensioning of various components of the micro-valve. For example, in some embodiments, the spacing and sealing members described herein are formed in a single manufacturing step (e.g., through etching a portion of a wafer to form the spacing member and the sealing member in using a single etch) to ensure that they have the same thickness. Constructing these components in such a manner allows for precise control over the arrangement of components attached to the actuating beam, such as the dimensions of the sealing member and the length of the actuating beam. This allows the sealing member to be precisely aligned with the valve seat, which ensures that an adequate seal between the valve seat and sealing member is formed. Furthermore, manufacturing the sealing member and spacing member in such a manner enables these structures to share a common thickness, which facilitates a proper spacing between the actuating beam and the orifice plate.

In another aspect, the actuating beam is specifically structured such that a desired default position is obtained. In various embodiments, in operation, the micro-valve described herein is attached to a fluid manifold to form a fluid plenum. The fluid plenum may hold a pressurized fluid. For example, in various embodiments the actuating beam is structured such that, when a fluid at a predetermined pressure (e.g., from 7-15 PSI) fills the plenum, the actuating beam has a defined curvature toward the valve seat to create a seal at the interface between the sealing member and the valve seat. In this regard, the actuating beam includes a tuning layer (e.g., a silicon dioxide layer and/or a silicon nitride layer) that is deposited to have a specific amount of compressive stress to obtain the desired curvature. As a result of the curvature of the actuating beam toward the valve seat, a tight seal is formed between the valve seat and the sealing member when the actuating beam is in the default position to prevent evaporation of the fluid contained in the plenum.

As described herein, the term "default position," when used in describing an actuating beam of a micro-valve, describes the position of the actuating beam with respect to various other components of the micro-valve without application of any control signals (e.g., an electrical charge, current or voltage) to the actuating beam. In other words, the default position is the position of the actuating beam (and any components attached thereto) when the actuating beam is in a passive state. It should be appreciated that other embodiments are envisioned in which the default position is an open position of the actuating beam.

In another aspect, the jetting assembly is constructed to prevent bowing of the orifice plate. Because the valve seat is disposed on the orifice plate, any curvatures induced in the orifice plate by, for example, adhesives attaching the micro-valve to a carrier, adversely impact the seal created at the interface between the valve seat and the sealing member. As such, prevention of such curvatures is critical to ensuring that the default seal is maintained. In this regard, the jetting assembly described herein includes an interposer or any other structural layer disposed between the carrier and the fluid manifold. The interposer is configured to add rigidity to the combination of the micro-valve and fluid manifold such that, when the combination is attached to the carrier via various adhesives, impacts of external strains induced by the adhesives are minimized.

Thus, a plurality of components of the jetting assembly described herein are constructed with the seal established at the interface between the sealing member and the valve seat in mind. The adequate seal beneficially prevents ink from leaking at the orifice, which occurs in conventional continuous inkjet jetting assemblies. Beneficially, the micro-valves employed herein can be tailored to provide a desired droplet size. For example, in one embodiment, the orifice in the orifice plate is 10-70 microns in diameter (e.g., 10, 20, 30, 40, 50, 60, or 70 microns, inclusive). In other embodiments, the orifice may have a diameter of up to 200 microns. In particular embodiments, the orifice plate may have a thickness in a range of 60-900 microns (e.g., 350 microns). In some embodiments, a ratio of a length of the diameter of the orifice may be in range of 1:1 to 15:1. An electrical signal may be applied to the actuating beam, which, via at least one layer of piezoelectric material contained therein, causes the actuating beam to temporarily depart from the valve seat to create a fluid outlet at the valve seat and orifice for a predetermined period (e.g., based on a desired droplet frequency). As such, based on the volume of the orifice and the droplet frequency, a volume of fluid is ejected from the orifice to formulate a droplet disposed on a substrate to create a desired marking. In various embodiments, with the droplet frequency configured at approximately 10 kHz, the micro-valve employed herein produces droplets having a volume of 200-600 picoliter (pL) (e.g., 200, 300, 400, 500, or 600 pL, inclusive). This is larger than those produced with conventional printing systems, which typically only generate droplets having a volume of approximately 30 pL. As a result of this larger drop size, the jetting assembly described herein may utilize a larger throw distance, thereby enabling images to be formed on a desired object at greater distances than conventional systems.

Referring now to FIG. 1, a perspective view of a jetting assembly 100 disposed in a holder 150 is shown, according to an example embodiment. Jetting assembly 100 includes a valve body 102 attached to a carrier 108. The holder 150 includes a substantially circular-shaped body having an opening contained therein adapted to receive the jetting assembly 100. Holder 150's body may include notches 118 extending from a peripheral edge thereof to facilitate attachment of the holder 150 to a marking device. The valve body 102 may be a component of a marking device. In an exemplary embodiment, the valve body 102 is used in an industrial marking device including a pressurized ink supply. In other embodiments, the valve body 102 or any of the micro-valves described herein may be used in pneumatic applications, where the fluid includes a gas (e.g., air, nitrogen, oxygen, etc.).

As described herein, the valve body 102 includes an input fluid manifold attached to a plurality of micro-valves. The micro-valves and the input fluid manifold form a fluid plenum configured to hold fluid received from an external fluid supply. In other embodiments, the valve body 102 may define a plurality of fluid plenums, each fluid plenum corresponding to at least a portion of the plurality of micro-valves. In such embodiments, each fluid plenum may be filled with a different colored ink (e.g., black, green, yellow, cyan, etc.) so as to provide multi-color capable jetting assembly. In various embodiments, the micro-valves include an actuating beam configured to move (e.g., bend, curve, twist, etc.) in response to voltages being applied thereto to temporarily open fluid outlets at orifices in an orifice plate. As a result, droplets are emitted from the fluid outlets onto a target to produce a desired marking pattern on the target.

As shown, a circuit board 104 is attached to a side surface of the carrier 108. Circuit board 104 may include a plurality of electrical pathways and provide a point of connection between valve body 102 and an electrical controller (e.g., via a wiring harness). The electrical controller may supply control signals via the electrical pathways to control actuation of the actuating beams of multiple micro-valves included in the valve body 102. The structure and function of such micro-valves are described in greater detail herein. In some embodiments, circuit board 104 itself includes a micro-controller that generates and provides control signals to actuate the micro-valves.

An identification tag 106 is attached to jetting assembly 100. In some embodiments, identification tag includes an internal memory configured to store various forms of information (e.g., manufacturing information, serial number, valve calibration information, settings, etc.) regarding jetting assembly 100. For example, in one embodiment, identification tag 106 is a radio frequency identification (RFID) tag configured to transmit the stored information in a receivable manner in response to receiving a predetermined identifier from an external device. This way, information regarding jetting assembly 100 may be quickly and efficiently retrieved.

Figure 2:
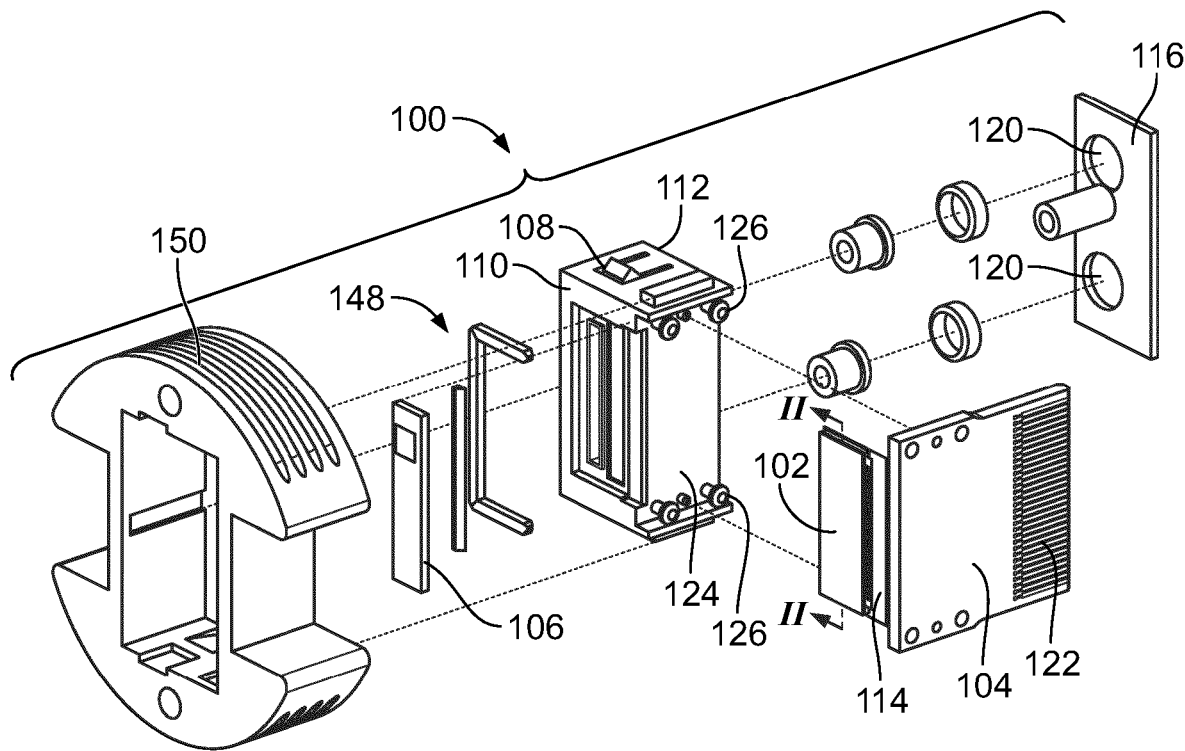
FIG. 2 is an exploded view of the jetting assembly shown in FIG. 1.

Referring now to FIG. 2, an exploded view of jetting assembly 100 is shown, according to an example embodiment. Carrier 108 includes a front-side surface 110, a rear-side surface 112, and a side surface 124. In various embodiments, valve body 102 is attached to front-side surface 110 via an adhesive. The rear-side surface 112 has a cover 116 disposed thereon. Cover 116 includes apertures 120 providing supply ports for fluid (e.g., ink) for deposition onto a target via the valve body 102. For example, in some embodiments, fluid (e.g., ink) is supplied to the valve body 102 via a first one of the apertures 120 (e.g., via an input supply line or hose), circulated through valve body 102, and output from the valve body 102 via a second one of the apertures 120. In other words, the fluid is recirculated through the fluid plenum. A septum may be positioned in each of the apertures 120 and configured to allow insertion of a fluid delivery or fluid return needle therethrough so as to allow communication of the fluid into the fluid plenum while maintaining fluidic sealing of the jetting assembly 100. In particular embodiments, the septum may include a single septum sheet which extends below each of the first one and the second one of the apertures. While not shown, in some embodiments, a heating element (e.g., a thermistor or resistive wire) may be positioned proximate to the valve body 102 or the carrier 108 (e.g., around or coupled to side wall thereof). The heating element may be used to selectively heat the fluid (e.g., ink) contained within the fluid plenum so as to maintain the fluid at a desired temperature.

Furthermore, a temperature sensor (not shown), e.g., a thermal sense resistor, may also be provided in the carrier 108, for example, to determine a temperature of the fluid flowing through the jetting assembly 100.

The front-side surface 110 includes a cavity adapted to receive valve body 102 such that valve body 102 is mounted securely to the front-side surface 110 (e.g., via an adhesive). Circuit board 104 is attached to carrier 108 via the side surface 124. As shown, the side surface 124 includes mounting pegs 126. In various embodiments, circuit board 104 includes apertures arranged in a manner corresponding to the arrangement of the mounting pegs 126 and are adapted to receive the mounting pegs 126 to align the circuit board 104 to the carrier 108.

As shown, circuit board 104 has a flex circuit 114 attached thereto. Flex circuit 114 extends at an angle from circuit board 104 and is attached to the carrier 108 proximate to the front-side surface 110. The valve body 102 and circuit board 104 are arranged perpendicularly to one another, as the flex circuit 114 extends around a corner boundary of front-side surface 110. Circuit board 104 also includes a controller interface 122 including electrical connection members (e.g., pins) configured to receive control signals from a marking system controller.

As described herein, in various embodiments, flex circuit 114 may be disposed between a fluid manifold and the carrier 108, or an interposer disposed between the carrier 108 and the valve body 102 to facilitate formation of electrical connections between flex circuit 114 and electrodes of the plurality of micro-valves included in valve body 102. In some embodiments, flex circuit 114 is attached to front-side surface 110 via a mounting member 148. An opening in flex circuit 114 is aligned with the septum in carrier 108 to provide a fluid inlet to a fluid plenum formed via the valve body 102.

Figure 3:
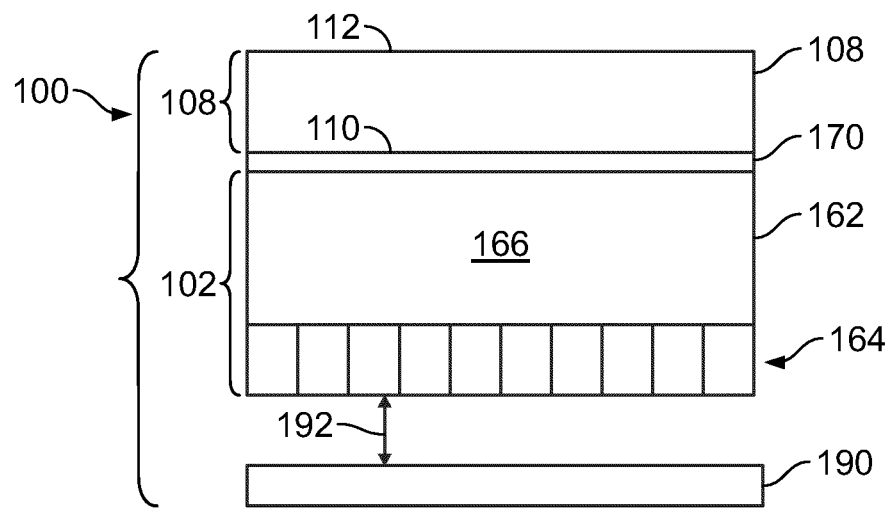
FIG. 3 is a schematic cross-sectional view of the jetting assembly shown in FIG. 1.

Referring now to FIG. 3, a schematic depiction of various components of jetting assembly 100 is shown, according to an example embodiment. For example, FIG. 3 may depict a cross sectional view of jetting assembly 100 at the line I-I shown in FIG. 1. As shown, the valve body 102 extends from front-side surface 110 of the carrier 108 via an interposer 170. The interposer 170 provides structure support to ensure maximal performance of various components in valve body 102. While not shown, in some embodiments, a compliant layer (e.g., a silicone or rubber layer) may also be disposed above or below the interposer 170 or any other location in the stack so as to provide stress relief.

The valve body 102 includes an input fluid manifold 162 and a plurality of micro-valves 164 attached to the input fluid manifold 162. The micro-valves 164 and input fluid manifold 162 form a fluid plenum 166 for fluid (e.g., a combination of ink and makeup fluid) received from a pressurized fluid supply (e.g., via apertures 120 in a cover 116 attached to the rear-side surface 112). In various embodiments, the fluid supply includes a fluid reservoir and a pump configured to provide pressurized fluid to jetting assembly 100 via a supply line coupled to carrier 108. In various embodiments, the fluid supply supplies fluid pressurized between 7 and 15 PSI when one or more of the micro-valves 164 are open. For example, in one embodiment, the fluid has a pressure of approximately 10 PSI. Carrier 108 may include an internal cavity configured to receive the pressurized fluid and deliver the fluid to the fluid plenum 166. In various embodiments, a pressure differential may be maintained between the fluid plenum and the fluid supply so as to drive the fluid out of the valve body 102. A pressure sensor may be provided in the valve body 102 and/or the carrier 10 to determine the pressure differential and/or pumping pressure of fluid pumped through the valve body 102.

Input fluid manifold 162 may include a glass structure including a channel forming the fluid plenum. Generally, the micro-valves 164 include actuating beams held in spaced relation to orifices on an orifice plate at the fluid-emitting or front-side surface 110. The actuating beams may include at least one layer of piezoelectric material (e.g., a d31 piezoelectric material) configured to deflect in response to receiving control signals (e.g., electrical voltage waveforms provided via controller interface 122 on the circuit board 104). As described herein, application of such electrical signals causes the micro-valves 164 to open, which causes droplets to be released at the orifice plate. The droplets advance a throw distance 192 onto a substrate 190 to produce a desired pattern on the substrate 190. In some embodiments, a mass of a single fluid droplet dispensed by a micro-valve 164 or any other micro-valve described herein may be in a range of 200 nanograms to 300 nanograms. In some embodiments, a volume of a single droplet dispensed may be in a range of 200 picoliter to 300 picoliter. The structure and function of various components of micro-valves 164 is described in greater detail herein. In other embodiments, the actuating beam may include a stainless steel actuating beam (e.g., having a length of approximately 1 mm). In still other embodiments, the actuating beam may include a bimorph beam having a two layers of piezoelectric material disposed on either side of a base layer (e.g., a base silicon layer). An electrical signal (e.g., an electrical voltage) may be applied to either one of the piezoelectric layers so as to urge the actuating beam to bend towards the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance towards or away from the orifice.

While embodiments described herein generally describe the actuating beam as including a piezoelectric material, in other embodiments, any other actuation mechanism may be used. For example, in some embodiments, the actuating beams may include a capacitive coupling for moving the actuating beams. In other embodiments, the actuating beams may include an electrostatic coupling. In still other embodiments, he actuating beams may include a magnetic coupling (e.g., an electromagnetic structure activated by an electromagnet) for moving the beam. In yet other embodiments, the actuating beams may comprise a temperature sensitive bimetallic strip configured to move in response to temperature change.

Interposer 170 generally adds rigidity to various portions of the valve body 102. For example, the interposer 170 may be constructed to be more rigid than components (e.g., the orifice plate, the actuating beam, etc.) of valve body 102 to counteract stressed induced by attaching such components to one another. For example, the interposer 170 may be attached to valve body 102 to counteract stresses induced by an adhesive used to attach the carrier 108 to the valve body 102. Additionally, the interposer 170 may counteract stresses at interfaces between the input fluid manifold 162 and micro-valves 164.

Figure 4A:
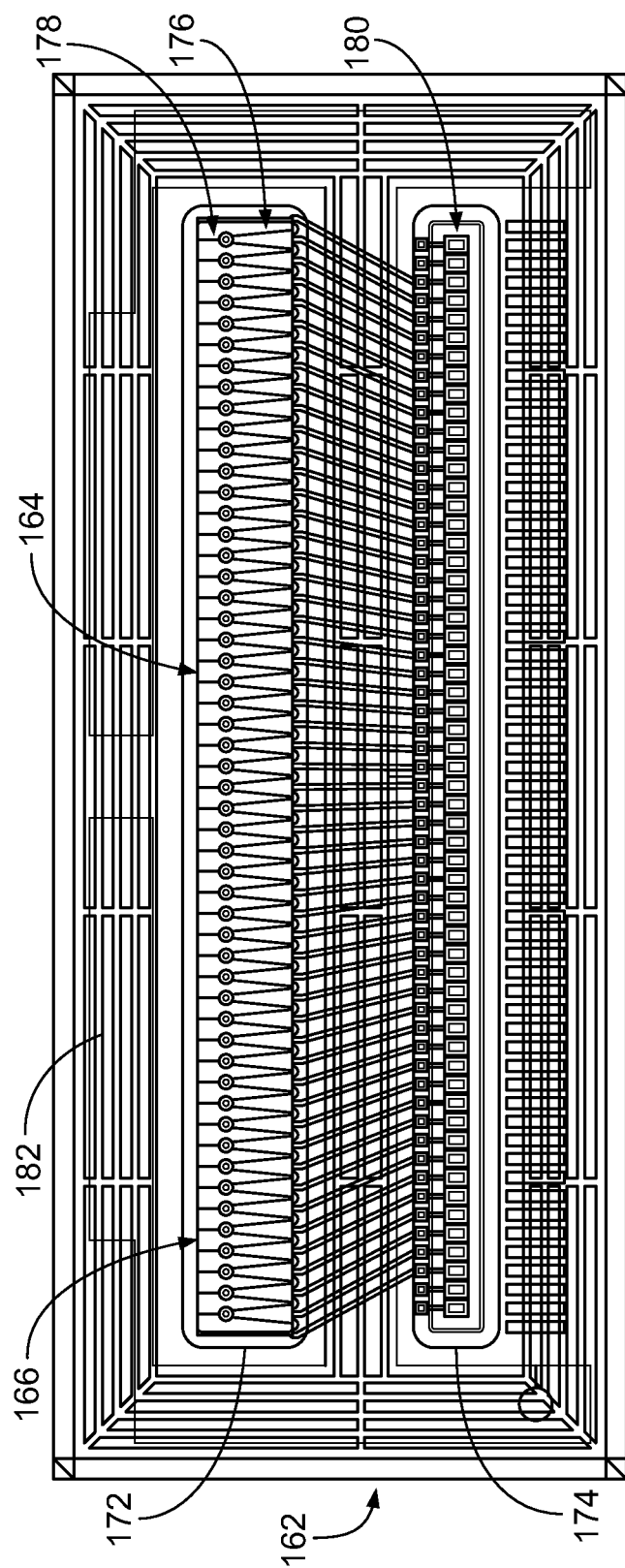
FIG. 4A is a plan view of the jetting assembly shown in FIG. 1.

Referring now to FIG. 4A, a plan view of the jetting assembly 100 is shown, according to an example embodiment. FIG. 4A shows a cross section of valve body 102 at the line II-II shown in FIG. 2. As such, FIG. 4A shows a plan view at an interface between input fluid manifold 162 and interposer 170. Input fluid manifold 162 includes a first opening 172 and a second opening 174. The first opening 172 exposes the plurality of micro-valves 164 to form the fluid plenum 166 configured to hold fluid received from a fluid supply.

In the example shown, the plurality of micro-valves 164 include a plurality of actuating beams 176 aligned in a single row. Each of the plurality of actuating beams 176 has a sealing member 178 disposed at an end thereof. In some embodiments, the sealing members 178 are aligned with and contact valve seats disposed at orifices in the orifice plate to prevent fluid contained in the fluid plenum 166 from escaping the fluid plenum 166 in the absence of any electrical signals. The jetting assembly 100 is shown to include 52 actuating beams 176 forming 52 micro-valves 164.

In various embodiments, each of the plurality of actuating beams 176 extends from a member disposed underneath a boundary between the first and second openings 172 and 174. Each of said members may include an electrical connection portion exposed via the second opening 174. Electrical contact pads 180 are disposed at each of the electrical connection portions. Wire bonds electrically connect each of the electrical connection portions to the controller interface 122 via electrical contact pads 180. As such, electrical signals may be received by each of the actuating beams 176 via the electrical contact pads 180. In some embodiments tape-automated bonding (TAB) may be used to electrically connect each of the electrical connection portions to the controller interface.

The boundary between the first and second openings 172 and 174 isolates the electrical contact pads 180 from the fluid contained in a reservoir formed by the first opening 172. Also beneficially, the electrical contact pads 180 are disposed beneath input fluid manifold 162. This means that electrical connections between actuating beams 176 are disposed on the interior of carrier 108 and are protected from deterioration and external contamination.

To isolate electrical contact pads 180 from the fluid contained in the fluid plenum 166, an adhesive structure 182 is disposed on input fluid manifold 162. Adhesive structure 182 couples the input fluid manifold 162 to the orifice plate. As shown, adhesive structure 182 forms "racetracks" around each of the first and second openings 172 and 174. The racetracks provide barriers for fluid that seeps between the input fluid manifold 162 and the orifice plate as well as prevent particles from entering the input fluid manifold. The racetrack adhesive structure 182 may be present on one or both of the input fluid manifold 162 side or the orifice plate side. For example, the racetracks may be constructed of several concentric rectangular loops of an adhesive material (e.g., a photo resist such as a bisphenol-A novalac glycidyl ether based photoresist sold under the tradename SU-8 or polymethylmethacrylate, polydimethylsiloxane, silicone rubber, etc.) around each of the first and second openings 172 and 174. Segments of adhesive material may cut across multiple ones of the rectangular loops to form compartments for receiving seeping fluid. Such an adhesive structure 182 facilitates fluidic isolation between micro-valves 164 and electrical contact pads 180. In other embodiments, the adhesive structure 182 may be formed from silicon and used to bond the input fluid manifold 162 to the orifice plate via fusion bonding, laser bonding, adhesives, stiction, etc. The adhesive structure 182 may be disposed on the input fluid manifold 162 and the valve body 102 coupled thereto, disposed on the valve body 102 and the input fluid manifold 162 coupled thereto, or disposed on each of the input fluid manifold 162 and the valve body 102 before coupling the two.

Figure 4B:
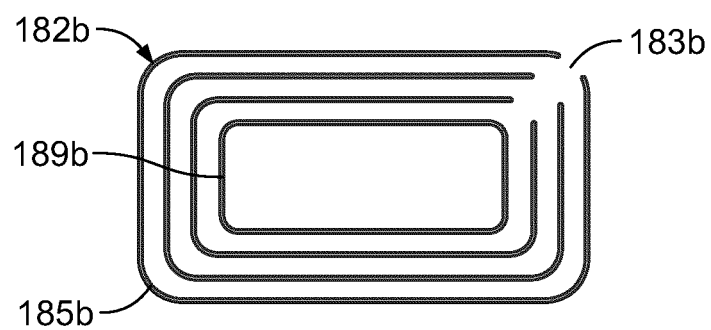
FIG. 4B is a schematic illustration of an adhesive structure that may be used in the jetting assembly of FIG. 1, according to an example embodiment.

In some embodiments, the adhesive structure 182 may be vented. For example, FIG. 4B shows a schematic illustration of an adhesive structure 182b. The adhesive structure 182b may be formed from SU-8, silicon or any other suitable material and includes a plurality of loops 189b such that the adhesive structure has a race track shape. An inner most loop of the plurality of loops 189b of the adhesive structure 182b that surrounds the input fluid manifold 162 forms a closed loop. In contrast, the remaining of the plurality of loops 189b positioned radially outwards of the inner most loop include vents 183b, for example, slots or openings defined therein. The vents 183b may facilitate bonding of input fluid manifold 162 to the orifice plate by allowing air that may get trapped in between the plurality of loops 189b of the adhesive structure 182b to escape via the vents 183b. While FIG. 4B shows the vents 183b being radially aligned with each other and located at corners of each loop, in other embodiments, one or more vents 183b of one loop may be radially offset from a vent defined in an adjacent loop and formed at any suitable location in each of the plurality of loops 189b.

As shown in FIG. 4B, corners of the each loop of the adhesive structure 182b may be rounded. Furthermore, corners of the input fluid manifold 162, the interposer 170, the flex circuit 114 or any other layers or components included in the jetting assembly 100 may be rounded, for example, to reduce stress concentration that can occur at sharp corners.

Figure 5A:
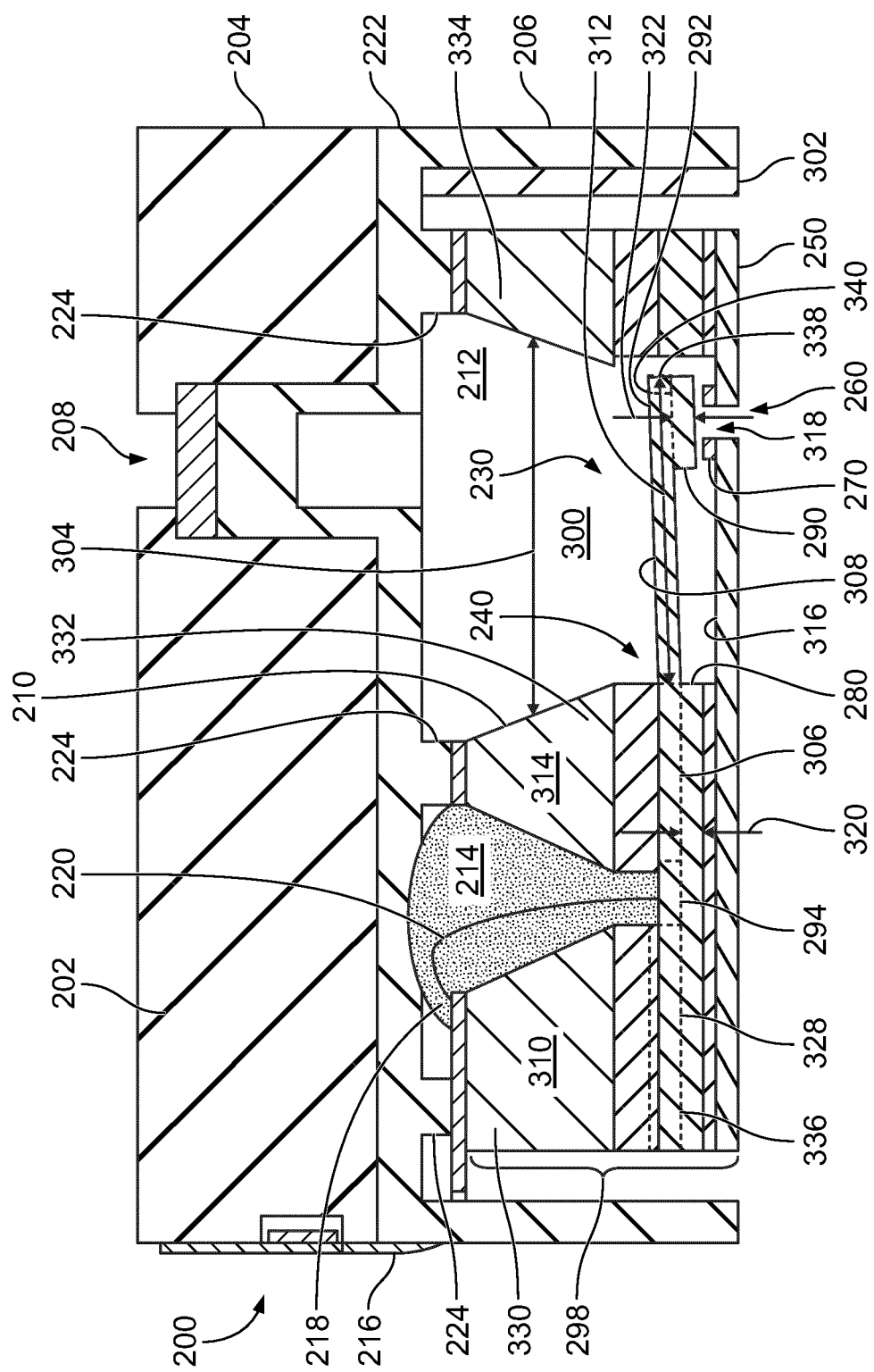
FIG. 5A is a-cross sectional view of a jetting assembly including a micro-valve, according to an example embodiment.

Referring now to FIG. 5A, a cross sectional view of a jetting assembly 200 including a micro-valve 230 is shown, according to an example embodiment. In some embodiments, jetting assembly 200 is an example embodiment of the jetting assembly 100 described with respect to FIGS. 1, 2, 3, and 4A-4B. As shown, jetting assembly 200 includes a carrier 202 attached to a valve body 298 via a structural layer 222. The structural layer 222 may be part of the carrier 202.

Carrier 202 includes an upper portion 204 and a housing portion 206 extending from an edge of upper portion 204. Upper portion 204 includes a septum 208 by which pressurized ink is provided. Housing portion 206 defines a cavity into which the valve body 298 is disposed. Valve body 298 includes an input fluid manifold 210 and the micro-valve 230. As shown, input fluid manifold 210 and micro-valve 230 define a reservoir 300 configured to hold a volume of pressured fluid received from an external fluid supply via septum 208. In various embodiments, the pressurized fluid held within the reservoir 300 is a combination of an ink and additional fluids in a liquid state.

Carrier 202 may be formed of plastic, ceramic, or any other suitable material. Carrier 202 facilitates operation of the jetting assembly 200 by providing structural support to valve body 298. For example, in some embodiments, peripheral edges of valve body 298 are attached to housing portion 206 via layers of adhesive 302 disposed at the inner surface of housing portion 206. Such adhesive facilitates maintenance of a desired relative positioning between micro-valve 230 and input fluid manifold 210.

In various embodiments, input fluid manifold 210 is pre-formed prior to its attachment to the additional components of the jetting assembly 200. Input fluid manifold 210 is formed by a body 310 (e.g., formed from glass, silicon, silica, etc.) having any suitable thickness (e.g., 500 microns). Input fluid manifold 210 is formed by a body 310 (e.g., formed from glass, silicon, silica, etc.) having any suitable thickness (e.g., 500 microns). As shown, input fluid manifold 210 is pre-formed to include a first arm 330, a second arm 332, and a third arm 334. As used herein, the term "arm," when used to describe the input fluid manifold 210, is used to describe a structure separating openings contained in the input fluid manifold 210. As such, the arms 330, 332, and 334 may have any suitable shape. For example, in some embodiments, the arms 330, 332, and 334 are substantially rectangular-shaped, having substantially planar side surfaces. In other embodiments, the side surfaces may be angled such that the arms 330, 332, and 334 are substantially trapezoidal-shaped. The arms 330, 332, and 334 may be formed by creating openings in a structure (e.g., a silicon or glass structure) using any suitable method (e.g., wet etching or dry etching such as deep reactive ion etching).

As shown, a first channel 212 separates the arms 330 and 332 from one another and a second channel 214 separates the arms 332 and 334 from one another. The first and second channels 214 are substantially linear and parallel to one another in the shown embodiment, but input fluid manifold 210 may be arranged as needed for the arrangement of micro-valves to be disposed thereon. First channel 212 is formed to have a width 304 bearing a predetermined relationship to a length 312 of a cantilevered portion 308 of an actuating beam 240 of the micro-valve 230, for example, in a range of about 500-1,000 micron. For example, first channel 212 may be formed to have a width 304 greater than a desired length 312 of cantilevered portion 308 by a threshold amount. Second channel 214 provides an avenue for an electrical connection to be formed between the actuating beam 240 and a flex circuit 216 via wire bonds 220 extending in between. Beneficially, using such an arrangement internalizes electrical connections between actuating beam 240 and flex circuit 216. In other words, electrical connections between such components are not external to carrier 202, and are thus less vulnerable to degradation. In various embodiments, the first channel 212 and/or the second channel 214 may have inclined sidewalls.

As shown, second channel 214 is substantially filled with an encapsulant 218. Encapsulant 218 may include an epoxy-type or any other suitable material. Encapsulant 218 envelopes electrical connections formed between wire bonds 220, the flex circuit 216, and actuating beam 240 and is configured to protect the wire bonds 220 from physical damage, moisture and corrosion. Thus, encapsulant 218 ensures the maintenance of an adequate electrical connection between flex circuit 216 and actuating beams 240 to facilitate providing electrical control signals to actuating beams 240 to cause movement thereof to open and close micro-valve 230.

The second arm 332 serves as a barrier preventing fluid contained in the reservoir 300 from reaching the electrical connections. The portion 314 of input fluid manifold 210 separating the first and second channels 212 and 214 serves as a barrier preventing fluid contained in the reservoir 300 from reaching the electrical connections. As such, input fluid manifold 210 serves as both part of the reservoir 300 for pressured fluid received from an external fluid supply and an insulating barrier between the pressured fluids and any electrical connections contained within jetting assembly 200. First and second channels 212 and 214 may be formed using any suitable process (e.g., via sandblasting, physical or chemical etching, drilling, etc.). In some embodiments, rather than being constructed of glass, input fluid manifold 210 is constructed of silicon, silica, ceramics or any other suitable material. In some embodiments, the input manifold 210 may be bonded to the micro-valve 230 via glass frit, solder or any other suitable adhesive.

With continued reference to FIG. 5A, micro-valve 230 includes an orifice plate 250 attached to actuating beam 240. The orifice plate 250 may be formed from any suitable material, for example, glass, stainless steel, nickel, nickel with another layer of electroplated metal (e.g., stainless steel), polyimide (e.g., kapton) or a photoresist (e.g., SU-8, polymethylmethacrylate, etc.). In some embodiments, the orifice plate 250 may be substantially flat, for example, have a flatness with a coefficient of variance of less than 3 microns over a length and width of the orifice plate 250 of at least 15 mm, such that the orifice plate 250 is substantially free of bow or twist. Furthermore, the orifice plate 250 may have any suitable thickness. In some embodiments, the orifice plate 250 may have a thickness in a range of 30 microns to 60 microns (30, 40, 50, or 60 microns). In other embodiments, the orifice plate 250 may have a thickness in a range of 100 microns to 400 microns (e.g., 100, 150, 200, 250, 300, 350, or 400 microns). Thicker orifice plates 250 may facilitate realization of a flatter orifice plate.

Orifice plate 250 is substantially planar and includes an orifice 260 extending between surfaces thereof. In various embodiments, the orifice 260 is substantially cylindrical-shaped and has a central axis that is perpendicular or substantially perpendicular to surfaces of orifice plate 250. A valve seat 270 is disposed on an internal surface 316 of orifice plate 250 proximate to orifice 260. In various embodiments, valve seat 270 comprises a compliant material that surrounds or substantially surrounds orifice 260. In some embodiments, valve seat 270 is constructed from an epoxy-based adhesive such as an SU-8 photoresist. In other embodiments, the valve seat 270 may be formed from a moldable polymer, for example, polydimethylsiloxane or silicone rubber. In still other embodiments, the valve seat 270 may be formed from a non-compliant material such as silicon. In some embodiments, a compliant layer, for example, a gold layer may be disposed on a surface of the valve seat 270 which is contacted by the actuating beam 240. Valve seat 270 defies an interior opening 318 substantially aligned with orifice 260 to create an outlet for pressured fluid contained in the reservoir 300. In particular embodiments, the valve seat 270 might be excluded.

As shown, the actuating beam 240 includes a base portion 306 and a cantilevered portion 308. Base portion 306 extends underneath the portion 314 of input fluid manifold 210 separating the first and second channels 212 and 214. As shown, the base portion 306 includes an electrical connection portion 294 in a region that overlaps with the second channel 214. Electrical connection portion 294 includes an electrode through which an electrical connection is formed with flex circuit 216 via wire bonds 220. The cantilevered portion 308 extends into the reservoir 300 from the portion 314 of input fluid manifold 210. As shown, cantilevered portion 308 is disposed on a spacing member 280 and, as a result, is spatially separated from orifice plate 250. Thus, there is space on either side of cantilevered portion 308 such that the actuating beam 240 may bend towards and/or away from the orifice plate 250 as a result of application of electrical signals thereto via electrical connection portion 294. The spacing member 280 is configured to prevent squeeze film damping of the actuating beam.

Cantilevered portion 308 has a length 312 such that the cantilevered portion extends from a boundary of the reservoir 300 by a predetermined distance. In various embodiments, the predetermined distance is specifically selected such that a portion 292 of cantilevered portion 308 overlaps the valve seat 270 and orifice 260. A sealing member 290 extends from the portion 292 of the actuating beam 240 overlapping orifice 260. In some embodiments, sealing member 290 is constructed to have a shape that substantially corresponds to a shape of orifice 260. For example, in one embodiment, both orifice 260 and sealing member 290 are substantially cylindrical-shaped, with sealing member 290 having a larger outer diameter. Such a configuration facilitates sealing member 290 covering orifice 260 in its entirety to enable a seal to be formed between sealing member 290 and valve seat 270. In other embodiments, the orifice 260 may have any other shape, e.g., star shape, square, rectangular, polygonal, elliptical or an asymmetric shape. In particular embodiments, the valve seat 270 may define a recess size and shaped to receive the sealing member 290. In various embodiments, the orifice plate 250 and therefore, the orifice 260 may be formed from a non-wetting (e.g., hydrophobic) material such as silicon or Teflon. In other embodiments, a non-wetting (e.g., hydrophobic) coating may be disposed on an inner wall of the orifice 260. Such coatings may include, for example, Teflon, nanoparticles, an oleophilic coating or any other suitable coating.

In various embodiments, spacing member 280 and sealing member 290 are constructed of the same materials and have equivalent or substantially equivalent thicknesses 320 and 322 (e.g., silicon, SU-8, silicon rubber, polymethylmethacrylate, etc.). In such embodiments, when actuating beam 240 extends parallel to orifice plate 250, lower surfaces of spacing member 280 and sealing member 290 are aligned with one another. When actuating beam 240 is placed into a closed position (as described herein), a surface of sealing member 290 contacts valve seat 270 to close the fluid outlet formed at orifice 260 (e.g., a sealing surface of the sealing member 290 may be configured to extend approximately 2 microns beneath a lower surface of spacing member 280 if the valve seat 270 was not present). Valve seat 270 and sealing member 290 may be dimensioned such that sufficient surface area of the sealing member 290 contacts valve seat 270 when actuating beam 240 is placed in the closed position (e.g., when an electrical signal is removed from or applied to actuating beam 240 via wire bonds) to prevent fluid from traveling from reservoir 300 to orifice 260. For example, the sealing member 290 may have a larger diameter or otherwise cross-section than the valve seat 270. In some embodiments, a compliant material (e.g., a gold layer) maybe disposed on a surface of the sealing member 290 that is configured to contact the valve seat 270.

Various aspects of jetting assembly 200 are designed to ensure formation of an adequate seal between valve seat 270 and sealing member 290. For example, structural layer 222 disposed on input fluid manifold 210 prevents bowing of orifice plate 250 resulting from stressed induced thereon via adhesives coupling components of micro-valve 230 to one another and the micro-valve 230 to housing portion 206. In various embodiments, structural layer 222 is constructed to have a greater rigidity than orifice plate 250 to perform this function. Structural layer 222 may be constructed of silicon or any other suitable material. As shown, structural layer 222 includes protruding portions 224 extending from a main portion thereof. Protruding portions 224 are attached to an upper surface of input fluid manifold 210 (e.g., at boundaries of first and second channels 212 and 214). In certain embodiments, protruding portions 224 are omitted. A seal is formed at protruding portions 224 via, for example, an adhesive disposed between structural layer 222 and flex circuit 216. Protruding portions 224 provide clearance above the input fluid manifold 210. Such clearance facilitates disposal of encapsulant 218 that completely covers all points of contact between wire bond 220 and flex circuit 216. In some embodiments, the carrier 202 include the structural layer 222 such that the stiffness is provided by the carrier 202.

In another aspect, actuating beam 240 is constructed such that a tight seal is formed at the interface between valve seat 270 and sealing member 290 when in the closed position. Actuating beam 240 may include at least one layer of piezoelectric material. The layer of piezoelectric material may include lead zirconate titanate (PZT) or any suitable material. The layer of piezoelectric material has electrodes electrically connected thereto. In various embodiments, wire bonds 220 are attached to said electrodes such that electrical signals from flex circuit 216 are provided to the layer of piezoelectric material via the electrodes. The electrical signals cause the actuating beam 240 to move (e.g., bend, turn, etc.) with respect to its default position. In other embodiments, the actuating beam 240 may include a stainless steel actuating beam (e.g., having a length of approximately 1 mm). In still other embodiments, the actuating beam 240 may include a bimorph beam having a two layers of a piezoelectric material disposed on either side of a base layer (e.g., a base silicon layer). An electrical signal (e.g., an electrical voltage) may be applied to either one of the piezoelectric layers so as to urge the actuating beam to bend towards the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance.

As shown, wire bonds 220 are attached to actuating beam 240 at an electrical connection portion 294 thereof. Electrical connection portion 294 includes a wire-bonding pad (e.g., constructed of gold, platinum, rubidium, etc.) conductively connected to at least one electrode within actuating beam 240. Beneficially, electrical connection portion 294 is separated from the cantilevered portion of actuating beam 240. In other words, electrical connection portion 294 is separated from the fluid contained in jetting assembly 200 via seals formed at the points of connection between input fluid manifold 210 and actuating beam 240. In some embodiments, the wire bonds 220 and/or the encapsulant 218 may be routed out through an opening provided in the orifice plate 250.

In various embodiments, actuating beam 240 is constructed such that the closed position is its default position. In other words, various layers in the actuating beam 240 are constructed such that the actuating beam curves towards orifice 260 as a result of force supplied via pressured fluid contained in the reservoir. A tuning layer within actuating beam 240 may be constructed to be in a state of compressive stress to cause a curvature in actuating beam towards the orifice. As a result of such curvature, sealing member 290 contacts valve seat 270 in the absence of any electrical signals applied to the actuating beam 240 to close the fluid outlet. The degree of curvature may be specifically selected to form a tight seal at the interface between sealing member 290 and valve seat 270 with the actuating beam 240 in the default position. Beneficially, such a default seal prevents evaporation of the fluid contained in jetting assembly 200, which prevents clogging and other defects.

The actuating beam 240, as shown in FIG. 5A, is bent away from orifice plate 250. Accomplishment of such a bend results from application of an electrical signal to actuating beam 240 via flex circuit 216. For example, flex circuit 216 may be electrically connected to an external controller supplying electrical signals relayed to actuating beam 240.

As illustrated by FIG. 5A, application of the electrical signal causes the actuating beam 240 to temporarily depart from its default position. For example, in various embodiments, the actuating beam 240 moves upward away from orifice 260 such that a portion of a sealing surface of sealing member 290 is at least 10 microns from an upper surface of valve seat 270. In one embodiment, a central portion of the sealing surface is approximately 15 microns from the valve seat 270 at a peak of its oscillatory pattern. As a result, an opening is temporarily formed between valve seat 270 and sealing member 290. The opening provides a pathway for a volume of fluid to enter orifice 260 to form a droplet at an exterior surface of the orifice plate 250. The droplets are deposited onto a substrate to form a pattern determined via the control signals supplied to each of the actuating beams 240 of each of the micro-valves 230 of jetting assembly 200. As will be appreciated, the frequency with which the actuating beam 240 departs from its default position to a position such as the one shown in FIG. 5 may vary depending on the implementation. For example, in one embodiment, the actuating beam 240 oscillates at a frequency of approximately 12 kHz. However, the actuating beam 240 may oscillate at a smaller (e.g., 10 kHz) or larger frequency (e.g., 20 kHz) in other implementations.

Figure 5B:
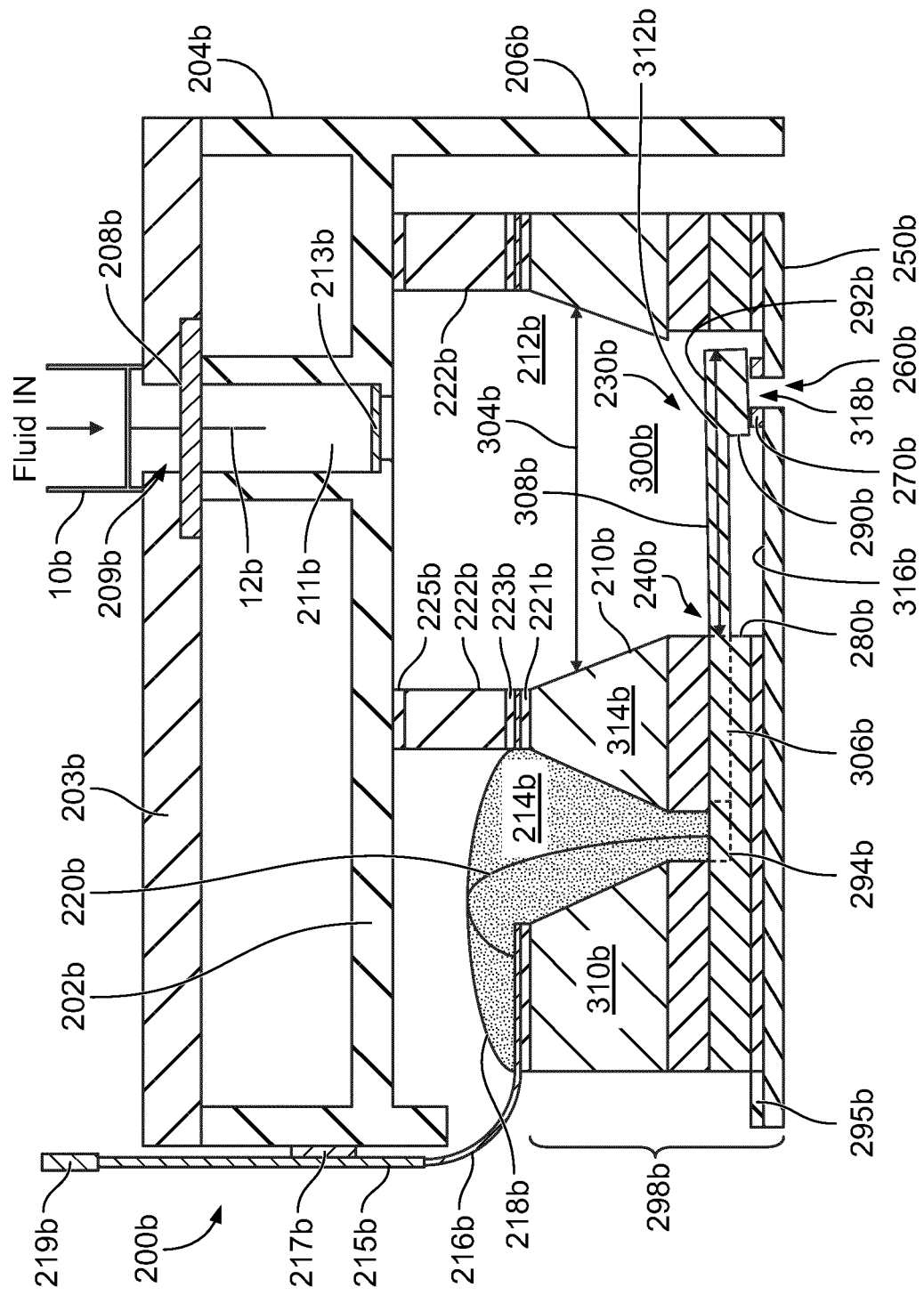
FIG. 5B is a-cross sectional view of a jetting assembly including a micro-valve, according to another example embodiment.

Referring now to FIG. 5B, a cross sectional view of a jetting assembly 200b including a micro-valve 230b is shown, according to an example embodiment. In some embodiments, jetting assembly 200b is an example embodiment of the jetting assembly 100 described with respect to FIGS. 1, 2, 3, and 4A-4B. As shown, jetting assembly 200b includes a carrier 202b attached to a valve body 298b via an interposer 222b.

Carrier 202b includes an upper portion 204b and a housing portion 206b extending from an edge of upper portion 204b. A fluid channel 211b is provided in the upper portion 204b. A septum 208b (e.g., a rubber or foam septum) is positioned at an inlet of the fluid channel 211b and a filter 213b is positioned at an outlet of the fluid channel 211b. A cover 203b (e.g., a plastic or glass cover) is positioned on the carrier 202b such that the septum 208b is positioned between the carrier 202b and the cover 203b, and secured therebetween. An opening 209b may be defined in the cover 203b and corresponds to the inlet of the fluid channel 211b. A fluid connector 10b is coupled to the cover 203b or the inlet of the fluid channel 211b. The fluid connector 10b includes an insertion needle 12b configured to pierce the septum 208b and be disposed therethrough in the fluid channel 211b. The fluid connector 10b is configured to pump pressurized fluid (e.g., ink) into an input fluid manifold 210b of the jetting assembly 200b via the insertion needle 12b. Furthermore, the filter 213b is configured to filter particles from the fluid before the fluid is communicated into a reservoir 300b. In some embodiments, the insertion needle 12b may be formed from or coated with a non-wetting (e.g., a hydrophobic material such as Teflon). In other embodiment, the insertion needle 12b may include heating elements, or an electric current may be provided to the insertion needle 12b so as to heat the insertion needle 12b and thereby, the fluid flowing therethrough into the reservoir 300b. In still other embodiments, metallic needles or any other heating element may be provided in the input fluid manifold 210b for heating the fluid contained therein. While shown as only including the fluid channel 211b, in some embodiments, the carrier 202b may also define a second fluid channel for allowing the fluid to be drawn out of the carrier 202b, i.e., cause the fluid to be circulated through the carrier 202b.

The housing portion 206b defines a cavity or a boundary within which the valve body 298b is disposed. Valve body 298 includes the input fluid manifold 210b and the micro-valve 230b. As shown, input fluid manifold 210b and micro-valve 230b define the reservoir 300b configured to hold a volume of pressured fluid received from an external fluid supply via the septum 208b. In various embodiments, the pressurized fluid held within the reservoir 300b is a combination of an ink and additional fluids in a liquid state.

In various embodiments, input fluid manifold 210b is pre-formed prior to its attachment to the additional components of the jetting assembly 200b. Fluid manifold 210b may be formed by a glass body 310b having any suitable thickness (e.g., 500 microns). As shown, input fluid manifold 210b is pre-formed to include a first channel 212b and a second channel 214b. First channel 212b is formed to have a width 304b bearing a predetermined relationship to a length 312b of a cantilevered portion 308b of an actuating beam 240b of the micro-valve 230b. Second channel 214b provides an avenue for an electrical connection to be formed between the actuating beam 240b and a flex circuit 216b via wire bonds 220b extending in between.

As shown, second channel 214b is substantially filled with an encapsulant 218b. The encapsulant 218b ensures the maintenance of an adequate electrical connection between flex circuit 216b and actuating beams 240b to facilitate providing electrical control signals to actuating beams 240b to cause movement thereof to open and close micro-valve 230b, and protects a wire bond 220b from physical damage or moisture, as previously described herein.

The portion 314b of input fluid manifold 210b separating the first and second channels 212b and 214b serves as a barrier preventing fluid contained in the reservoir 300b from reaching the electrical connections. As such, input fluid manifold 210b serves as both part of the reservoir 300b for pressured fluid received from an external fluid supply and an insulating barrier between the pressured fluids and any electrical connections contained within jetting assembly 200b.

The micro-valve 230b includes an orifice plate 250b attached to actuating beam 240b. Orifice plate 250b is substantially planar and includes an orifice 260b extending between surfaces thereof. A valve seat 270b is disposed on an internal surface 316b of orifice plate 250b proximate to orifice 260b. Valve seat 270b defies an interior opening 318b substantially aligned with orifice 260b to create an outlet for pressured fluid contained in the reservoir 300b. In particular embodiments, the valve seat 270b might be excluded. In some embodiments, the orifice plate 250b or any other orifice plate described herein may also be grounded. For example, an electrical ground connector 295b (e.g., a bonding pad such as a gold bond pad) may be provided on the orifice plate 250b and configured to allow the orifice plate 250b to be electrically ground (e.g., via electrical coupling to a system ground).

The actuating beam 240b includes a base portion 306b and a cantilevered portion 308b. Base portion 306b extends underneath the portion 314b of input fluid manifold 210b separating the first and second channels 212b and 214b. As shown, the base portion 306b includes an electrical connection portion 294b in a region that overlaps with the second channel 214b. Electrical connection portion 294b includes an electrode through which an electrical connection is formed with flex circuit 216b via wire bonds 220b. The cantilevered portion 308b extends into the reservoir 300b from the portion 314b of input fluid manifold 210b. As shown, cantilevered portion 308b is disposed on a spacing member 280b and, as a result, is spatially separated from orifice plate 250b.

Cantilevered portion 308b has a length 312b such that the cantilevered portion extends from a boundary of the reservoir 300b by a predetermined distance. In various embodiments, the predetermined distance is specifically selected such that a portion 292b of cantilevered portion 308b overlaps the valve seat 270b and orifice 260b. A sealing member 290b extends from the portion 292b of the actuating beam 240b overlapping the orifice 260b. In some embodiments, sealing member 290b is constructed to have a shape that substantially corresponds to a shape of orifice 260b.

The flex circuit 216b is positioned on the glass body 310b and the portion 314b of the input fluid manifold 210b, and coupled thereto via a first adhesive layer (e.g., SU-8, silicone rubber, glue, epoxy, etc.). An interposer 222b is positioned between the upper portion 204b of the carrier 202b and the input fluid manifold 210b so as to create gap between the upper portion 204b and the input fluid manifold 210b. This allows sufficient space for disposing the encapsulant 218 and increases a volume of the input fluid manifold 210b. As shown in FIG. 5B, the interposer 222b is positioned on and coupled to a portion of the flex circuit 216b via a second adhesive layer 223b (e.g., SU-8, silicone, or any other adhesive). Furthermore, the interposer 222b is coupled to a side wall of the upper portion 204b of the carrier 202b proximate to the micro-valve 230b via a third adhesive layer 225b (e.g., SU-8, silicone, or any other adhesive).

The interposer 222b may be formed from a strong, flat and rigid material (e.g., plastic, silicon, glass, ceramics, etc.) and disposed on input fluid manifold 210b so as to prevent bowing of the orifice plate 250b resulting from stressed induced thereon via adhesives coupling components of micro-valve 230b to one another and the micro-valve 230b to housing portion 206b. In various embodiments, interposer 222b is constructed to have a greater rigidity than orifice plate 250b to perform this function.

In another aspect, actuating beam 240b is constructed such that a tight seal is formed at the interface between valve seat 270b and sealing member 290b when in the closed position. Actuating beam 240b may include at least one layer of piezoelectric material (e.g., lead zirconate titanate (PZT) or any suitable material). The layer of piezoelectric material has electrodes electrically connected thereto and wire bonds 220b are attached to said electrodes such that electrical signals from flex circuit 216b are provided to the layer of piezoelectric material via the electrodes. The electrical signals cause the actuating beam 240b to move (e.g., bend, turn, etc.) with respect to its default position.

As shown, wire bonds 220b are attached to actuating beam 240b at an electrical connection portion 294b thereof, substantially similar to the wire bonds 220 described with respect to the jetting assembly 200 of FIG. 5A. In various embodiments, actuating beam 240b is constructed such that the closed position is its default position, as described in detail with respect to the actuating beam 240 of FIG. 5A.

The actuating beam 240b, as shown in FIG. 5B, is bent away from orifice plate 250b. Accomplishment of such a bend results from application of an electrical signal to actuating beam 240b via flex circuit 216b. For example, flex circuit 216b may be electrically connected to a circuit board 215b (e.g., a printed circuit board) extending perpendicular to a longitudinal axis of the actuating beam 240b along a sidewall of the carrier 202b. An identification tag 217b (e.g., the identification tag 106) may be positioned between the circuit board 215b and the sidewall of the carrier 202b. An electrical connector 219b is electrically coupled to the circuit board 215b and configured to electrically connect the flex circuit 216b to an external controller supplying electrical signals relayed to actuating beam 240b via the circuit board 215b.

As illustrated by FIG. 5B, application of the electrical signal causes the actuating beam 240b to temporarily depart from its default position. For example, in various embodiments, the actuating beam 240b moves upward away from orifice 260b such that a portion of a sealing surface of sealing member 290b is at least 10 microns from an upper surface of valve seat 270b, as described in detail with respect to the actuating beam 240 of FIG. 5A.

Figure 6:
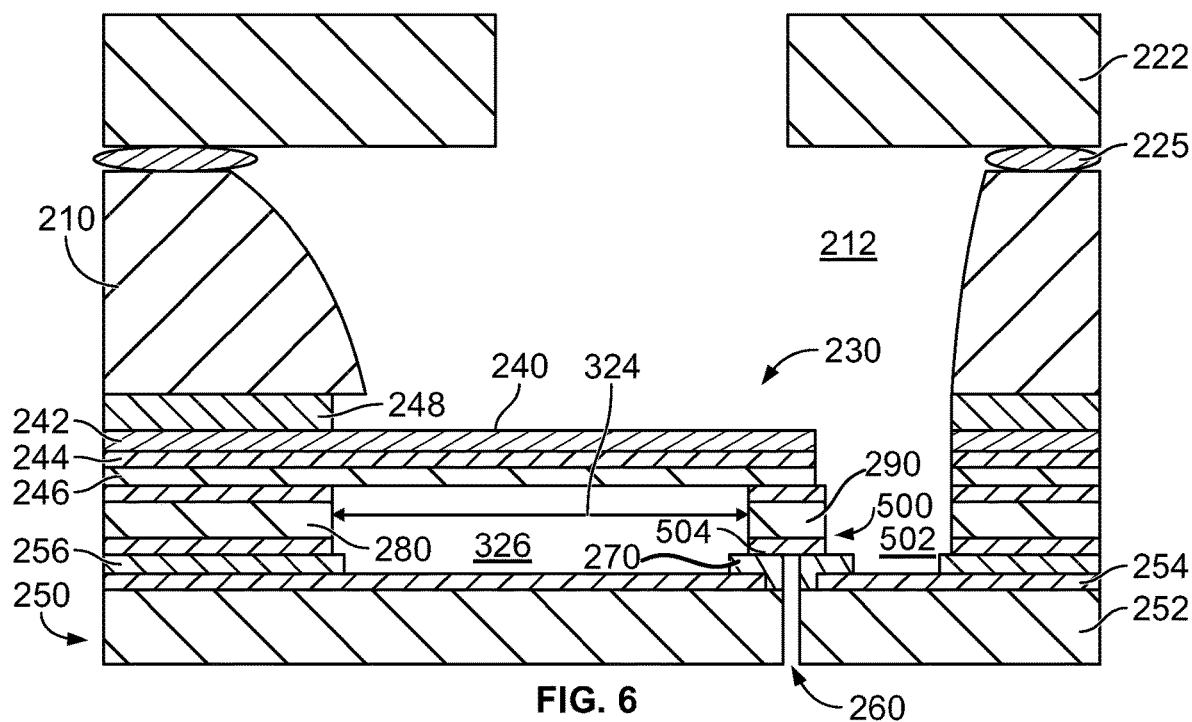
FIG. 6 is cross-sectional view providing a more detailed view of the jetting assembly shown in FIG. 5A.

Referring now to FIG. 6, a more detailed view showing various components of jetting assembly 200 described with respect to FIG. 5A is shown, according to an exemplary embodiment. As shown, actuating beam 240 includes an actuating portion 242, a tuning layer 244, and a non-active layer 246. Non-active layer 246 serves as a base for the tuning layer 244 and the actuating portion 242. The structure of actuating portion 242 and the tuning layer 244 are described in greater detail with respect to FIG. 7. In some embodiments, non-active layer 246 is constructed from silicon or other suitable material. In some embodiments, non-active layer 246, the spacing member 280, and sealing member 290 are all constructed from the same material (e.g., monolithically formed from a silicon wafer). In an example embodiment, non-active layer 246, the spacing member 280, and sealing member 290 are formed from a double silicon-on-insulator (SOI) wafer.

Spacing member 280 is shown to include an intermediate layer interposed between two peripheral layers. In an example embodiment, the intermediate layer and non-active layer 246 comprise two silicon layers of a double SOI wafer, with the peripheral layers disposed on either side of the intermediate layer including silicon oxide layers. In this example, the sealing member 290 and spacing member 280 are formed through etching the surface of the double SOI wafer opposite the actuating portion 242. Oxide layers serve to control or stop the etching process once, for example, the entirety of the intermediate layer forming the spacing member 280 is removed in a region separating the spacing member 280 and sealing member 290. Such a process provides precise control over both the width and thickness of the spacing and sealing members 280 and 290.

As will be appreciated, the size of sealing member 290 may contribute to the resonance frequency of actuating beam 240. Larger amounts of material disposed at or near an end of actuating beam 240 generally results in a lower resonance frequency of actuating beam. Additionally, such larger amounts of material may impact the actuating beam 240's default curvature induced from pressurized fluid contacting actuating beam 240. Accordingly, the desired size of sealing member 290 impacts various other design choices of actuating beam 240. Such design choices are described in greater detail with respect to FIG. 7A. In some embodiments, the sealing member 290 is sized based on the dimensions of orifice 260. In some embodiments, the sealing member 290 is substantially cylindrical and has a diameter approximately 1.5 times that of the orifice 260. For example, in one embodiment, sealing member 290 has a diameter of approximately 90 microns when the orifice 260 has a diameter of approximately 60 microns. Such a configuration facilitates alignment between sealing member 290 and orifice 260 such that sealing member 290 completely covers orifice 260 upon contacting valve seat 270. In another embodiment, the sealing member 290 is sized such that it has a surface area that approximately doubles that of orifice 260 (e.g., the spacing member 280 may have a diameter of approximately 150 microns, with the orifice 260 being approximately 75 microns in diameter). Such an embodiment provides greater tolerance for aligning sealing member 290 and orifice 260 to facilitate creating the seal between valve seat 270 and sealing member 290. In other embodiments, the diameter of the sealing member 290 may be 2 times, 2.5 times, 3 times, 3.5 times or 4 times to the diameter of the orifice 260. In various embodiments, a ratio of a length to diameter of the orifice 260 may be in range of 1:1 to 15:1. The ratio may influence shape, size and/or volume of a fluid droplet ejected through the orifice and may be varies based on a particular application.

Beneficially, the gap 324 between spacing member 280 and sealing member 290 creates a volume of separation 326 between actuating beam 240 and orifice plate 250. The volume of separation 326 prevents squeeze film damping of oscillations of actuating beam 240. In other words, insufficient separation between orifice plate 250 and actuating beam 240 would lead to drag resulting from fluid having to enter and/or exit the volume of separation 326 as the actuating beam 240 opens and closes the orifice 260. Having the greater volume of separation produced via spacing member 280 reduces such drag and therefore facilitates actuating beam 240 oscillating at faster frequencies.

With continued reference to FIG. 6, orifice plate 250 includes a base layer 252 and intermediate layer 254. For example, in one embodiment, base layer 252 comprises a silicon layer and intermediate layer 254 includes a silicon oxide layer. In the embodiment shown, a portion of the intermediate layer 254 proximate to orifice 260 is removed and a first portion of the valve seat 270 is disposed directly on base layer 252 and a second portion of the valve seat 270 is disposed on the intermediate layer 254. It should be understood that, in alternative embodiments, intermediate layer 254 extends all the way to boundaries of orifice 260 and valve seat 270 is disposed on intermediate layer 254. In still other embodiments, the removed portion of the intermediate layer 254 may have a cross-section equal to or greater than a cross-section of the valve seat 270 such that the valve seat 270 is disposed entirely on the base layer 252.

Due to the criticality of the spatial relationship between spacing member 280 and valve seat 270, attachment of spacing member 280 to orifice plate 250 is performed in a manner allowing precise control over the resulting distance between actuating beam 240 and orifice plate 250. As shown, an adhesive layer 256 is used to attach spacing member 280 to orifice plate 250. In various embodiments, a precise amount of epoxy-based adhesive (e.g., SU-8, polymethylmethacrylate, silicone, etc.) is applied to intermediate layer 254 prior to placement of the combination of spacing member 280 and actuating beam 240 thereon. The adhesive is then cured to form an adhesive layer 256 having a precisely controlled thickness. For example, in some embodiments, a lower-most surface of spacing member 280 is substantially aligned with an upper surface of valve seat 270. Any desired relationship between such surfaces may be obtained to create a relationship between sealing member 290 and valve seat 270 that creates an adequate seal when actuating beam 240 is in the default position. In various embodiments, the adhesive layer 256 and the valve seat 270 may be formed from the same material (e.g., SU-8) in a single photolithographic process.

In various embodiments, once the actuating beam 240 and orifice plate 250 are attached to one another via adhesive layer 256 (e.g., to form micro-valve 230), an additional adhesive layer 248 is applied to the periphery of the actuating beam 240. The additional adhesive layer 248 is used to attach input fluid manifold 210 to actuating beam 240. A structural layer 222 (or interposer 222b) may be positioned on the input fluid manifold 210 and coupled thereto via a second adhesive layer 225. In some embodiments, the additional adhesive layer 248 and the second adhesive layer 225 may include the same material as the adhesive layer 256.

Figure 7A:
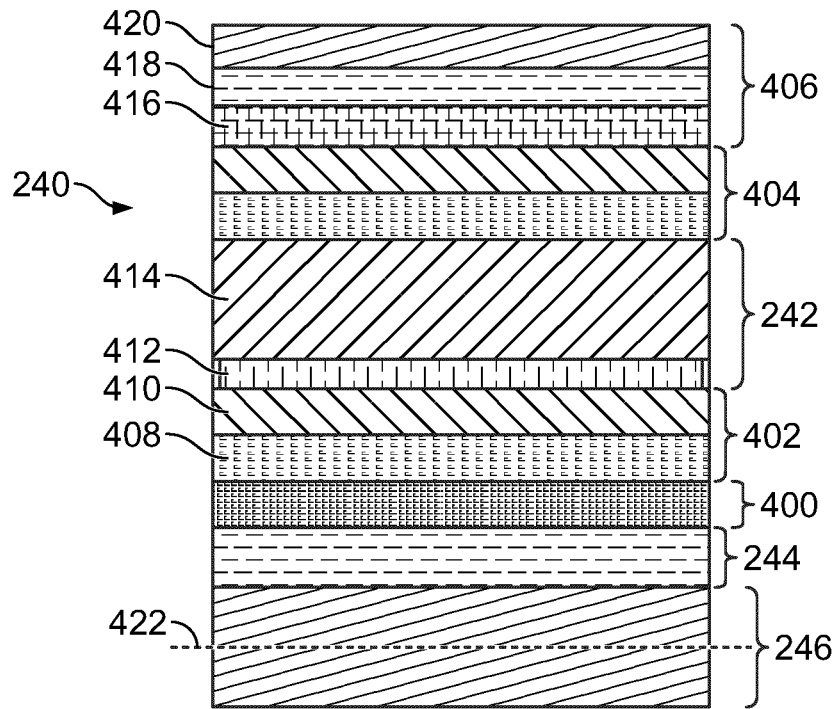
FIG. 7A is a side cross-sectional view of an actuating beam of a micro-valve, according to an example embodiment.

Referring now to FIG. 7A, a more detailed view of actuating beam 240 is shown, according to an example embodiment and not to scale. As shown, actuating beam 240 includes the non-active layer 246, the tuning layer 244, a barrier layer 400, a first electrode portion 402, the actuating portion 242, a second electrode portion 404, and a passivation structure 406. As will be appreciated, actuating beam 240 may include more or fewer layers in various alternative embodiments.

In some embodiments, tuning layer 244 is disposed directly on non-active layer 246. Tuning layer 244 generally serves as an adhesion layer for facilitating deposition of the additional layers described herein. Additionally, as described herein, a thickness of tuning layer 244 may play a critical role in determining an overall curvature in actuating beam 240 when in its default position. Speaking generally, tuning layer 244 is configured to have a predetermined tuning stress such that in the closed position, the sealing member 290 of the actuation beam 240 contacts and exerts a force on the valve seat 270 so as to fluidly seal the orifice 260. In some embodiments, in the absence of an electrical signal, the predetermined tuning stress is configured to cause the actuating beam 240 to curve towards the orifice 260 such that in the absence of the valve seat 270, the sealing surface of the sealing member 290 would be positioned a predetermined distance (e.g., 2 microns) beneath a lower surface of the spacing member 280. For example, the tuning layer 244 may be placed into a state of compressive stress as a result of the deposition of the additional layers described herein. As such, the thicker tuning layer 244 is, the greater curvature of actuating beam 240 towards orifice 260 when in its default position. The calibration of the tuning layer 244 is described in greater detail herein with respect to FIGS. 8, 9, and 10. In one example embodiment, the tuning layer 244 is constructed of silicon dioxide.

Barrier layer 400 acts as a barrier against diffusion of materials contained in the first piezoelectric layer 414 to the tuning layer 244. If left unchecked, such migration will lead to harmful mixing effects between constituent materials in the layers, adversely impacting performance. In various embodiments, barrier layer 400 is constructed of, for example, zirconium oxide or zirconium dioxide. As shown, first electrode portion 402 includes an adhesion layer 408 and a first electrode 410. The adhesion layer 408 facilitates deposition of the first electrode 410 on barrier layer 400 and prevents diffusion of matter in the first electrode 410 to other layers. In various embodiments, adhesion layer 408 is constructed of titanium. First electrode 410 may be constructed of platinum, gold, rubidium or any other suitable material to provide a conductive pathway for electrical signals to be provided to actuating portion 242. In some embodiments, first electrode portion 402 is only included in select portions of actuating beam 240. For example, first electrode portion 402 may only be included proximate to and/or within the electrical connection portion 294.

Actuating portion 242 may be formed from a single or multiple layers of any suitable piezoelectric material. In the example shown, active portion includes a growth template or seed layer 412 and a piezoelectric layer 414. Growth template layer 412 serves as a seed layer facilitating growth of the piezoelectric layer 414 having a desired texture (e.g., the {001} crystal structure and corresponding texture) to ensure maximal piezoelectric response. In some embodiments, growth template layer 412 is constructed of lead titanate. Piezoelectric layer 414 may be constructed of any suitable material, such as lead zirconate titanate (PZT).

Piezoelectric layer 414 may be deposited using any method, such as, utilizing vacuum deposition or sol-gel deposition techniques. In some embodiments, piezoelectric layer 414 may have a thickness in a range of approximately 1-6 microns (e.g., 1, 2, 3, 4, 5, or 6 microns, inclusive) and is adapted to produce a deflection at an end of actuating beam 240 of approximately 10 microns when an electrical signal is applied thereto. A deflection of 10 microns (e.g., such that a surface of sealing member 290 departs from valve seat 270 by slightly less than that amount) may be sufficient to produce droplets at orifice 260 having a desired size. In some embodiments, piezoelectric layer 414 has a piezoelectric transverse coefficient (d31 value) magnitude of approximately 140 to 160 pm/V. This value may enable adequate deflection of actuating beam 240 to be generated via electrical signals supplied to first and second electrode portions 402 and 404.

As shown, second electrode portion 404 is disposed on actuating portion 242. In various embodiments, second electrode portion 404 is structured similarly to first electrode portion 402 described herein. Application of a voltage to the first electrode portion 402 and/or second electrode portion 404 thus induces a strain in piezoelectric layer 414, causing the entirety of actuating beam 240 to bend away from the orifice plate 250. Through application of periodic control signals to first and second electrode portions 402 and 404, periodic cycling of actuating beam 240 generates droplets output from orifice 260 at a desired frequency. While FIG. 7A shows the first and second electrode portions 402 and 404 overlapping each other, in other locations, the first and second electrode portions 402 and 404 may not overlap. This may limit or prevent electron leakage between the first and second electrode portions 402 and 404 which can damage the piezoelectric layer 414 or cause electrical shorts.

The materials shown in FIG. 7A may extend substantially entirely through the length of actuating beam 240. As such, there is an overlap between electrode portions 402 and 404 and the reservoir formed via micro-valve 230. In various embodiments, the fluid contained in the reservoir is electrically conductive and/or corrosive to the materials forming the first and second electrode portions 402 and 404. Thus, it is preferable to isolate electrode portions 402 and 404 from the reservoir to prevent the fluid contained in the reservoir from contacting electrode portions 402 and 404.

In this regard, the passivation structure 406 is configured to perform such isolation. In the example shown, passivation structure 406 includes a dielectric layer 416, an insulator layer 418, and a barrier layer 420. Barrier layer 420 may be constructed of silicon nitride, which acts as a diffusion barrier against water molecules and ions contained in the fluid to prevent corrosion of electrode portions 402 and 404. In some embodiments, insulator layer 418 includes a silicon dioxide layer having a compressive stress that roughly counterbalances the tensile stress in barrier layer 420. Dielectric layer 416 may be constructed of aluminum oxide to prevent oxidation of the additional layers contained in actuating beam 240. In some embodiments, an additional metal layer is disposed on barrier layer 420. For example, the metal layer may be constructed of Talinum oxide or any other suitable, chemically-resistant metal to further enhanced the protective properties of passivation structure 406. In particular embodiments, the barrier layer 420 may be formed from Teflon or parylene. In other embodiments, at least a portion of the actuating beam 240, i.e., the structure formed by the layers shown in FIG. 7A may be covered or over coated by a Teflon or parylene layer. Such an overcoat may prevent micro-cracks from forming in the layers of the actuating beam 240. In still other embodiments, the over coat may include a metallic layer, for example, a tantalum or palladium layer.

The addition of passivation structure 406 may significantly impact the default positioning of actuating beam 240. This is so because passivation structure 406 is offset from a neutral axis 422 of compression of the actuating beam 240. As shown, the neutral axis 422 is within the non-active layer 246, which means that the electrode portion 404 and passivation structure 406 are the most distant therefrom in actuating beam 240. Given this, the tensile or compressive stresses induced in such layers will greatly influence the default curvature of actuating beam 240. As such, the thickness of tuning layer 244 is selected based on the structure of various constituent layers of passivation structure 406.

Figure 7B:
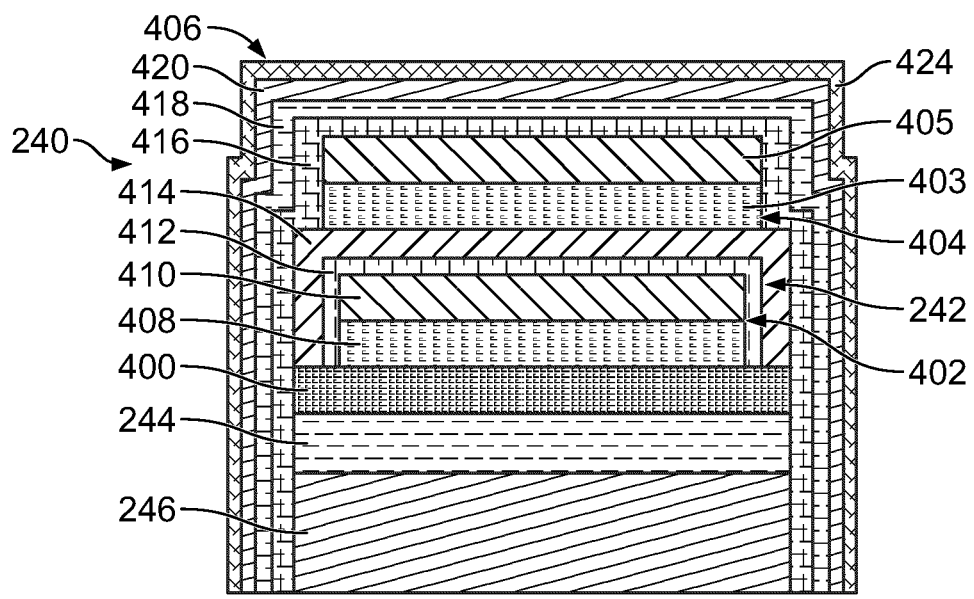
FIG. 7B is a front cross-sectional view of the actuating beam of FIG. 7A, according to another example embodiment.

FIG. 7B is front cross-sectional view of the actuating beam 240 showing an arrangement of each of the layers included in the actuating beam, according to an example embodiment and not to scale. As shown, actuating beam 240 includes the non-active layer 246, the tuning layer 244 and a barrier layer 400, as described with respect to FIG. 7A. The first electrode portion 402 includes the adhesion layer 408 (e.g., titanium oxide) positioned on the barrier layer 400, and a conductive layer or electrode 410 (e.g., platinum, gold, rubidium, etc.) positioned thereon. The first electrode portion 402 is configured to have a width which is less than a width of the barrier layer 400 such that ends of the electrode portion 402 in a direction perpendicular to a longitudinal axis of the actuating beam 240 are located inwards of the ends of the barrier layer 400 in the same direction.

The actuating portion 242 including the seed layer 412 and the piezoelectric layer 414 is conformally disposed on the first electrode portion 402 so as to extend beyond the lateral ends of the first electrode portion 402 and contact the barrier layer 400. In this manner the piezoelectric layer completely surrounds or encapsulates at least the portion of the first electrode portion 402 which overlaps or is proximate to the second electrode portion 404. The second electrode portion 404 includes an adhesion layer 403 (e.g., titanium) and a conductive layer 405 (e.g., platinum, gold, rubidium). In some embodiments, the second electrode portion 404 may include only the conductive layer 405 disposed directly on the piezoelectric layer 414 (i.e., the adhesion layer 403 is omitted). Since the actuation portion 242 overlap and extend beyond the ends of the first electrode portion 402, the actuation portion effectively electrically isolates the first electrode portion 402 from the second electrode portion 404, so as to prevent electron leakage and current migration which may be detrimental to the performance of the actuating beam 240.

The passivation structure 406 is conformally coats exposed portions of each of the other layers 246, 244, 400, 402, 242 and 404. However, a bottom surface of the non-active layer 246 may not be coated with the passivation structure 406. The passivation structure 406 may include a dielectric layer 416, an insulator layer 418, a barrier layer 420, and a top passivation layer 424. Barrier layer 420 may be constructed of silicon nitride, which acts as a diffusion barrier against water molecules and ions contained in the fluid to prevent corrosion of electrode portions 402 and 404. Silicon nitride, however, is generally in a state of tensile stress once deposited on the remaining layer. Insulator layer 418 is configured to counterbalance such tensile stress. For example, in some embodiments, insulator layer 418 includes a silicon dioxide layer having a compressive stress that roughly counterbalances the tensile stress in barrier layer 420. In various embodiments, the barrier layer 420 may be positioned beneath the insulator layer 418. Dielectric layer 416 may be constructed of aluminum oxide, titanium oxide, zirconium oxide or zinc oxide to prevent oxidation of the additional layers contained in actuating beam 240. Thus, passivation structure 406 serves to prevent both corrosion and oxidation—two major sources of defects caused by the presence of fluids—in actuating beam 240, and thus ensures long-term performance of micro-valve 230. Furthermore, the top passivation layer 424 is disposed on the barrier layer 420 and may include a Teflon or parylene layer. Such an overcoat may prevent micro-cracks from forming in the layers of the actuating beam 240, and may also prevent the underlying layer from a plasma discharge (e.g., which the buried layers may be exposed to in subsequent fabrication operations). In particular embodiments, the top passivation layer 424 may include a metallic layer, for example, a tantalum or palladium layer. In some embodiments, an additional metal layer is disposed on barrier layer 420. For example, the metal layer may be constructed of Talinum oxide or any other suitable, chemically-resistant metal to further enhanced the protective properties of passivation structure 406.

Figure 8:
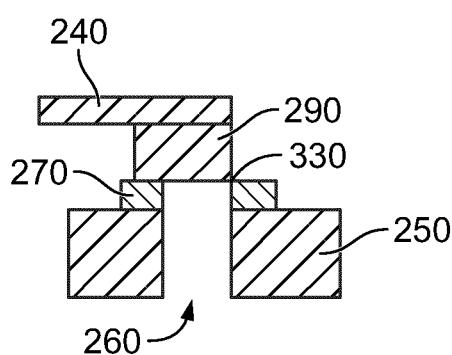
FIGS. 8, 9, and 10 are cross-sectional views of a valve seat and a sealing member of a micro-valve, according to various example embodiments.
Figure 9:
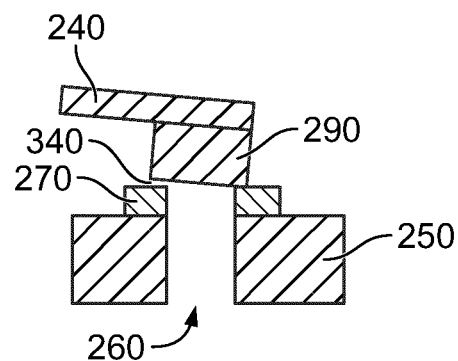
Figure 10:
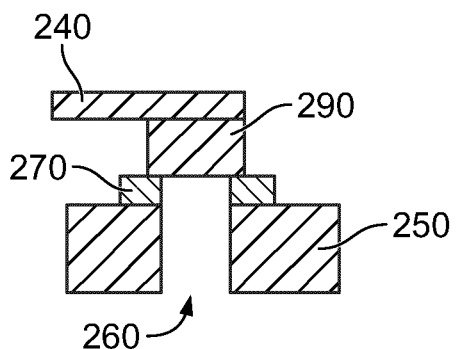

Referring now to FIGS. 8, 9, and 10 close-up views of orifice plate 250, valve seat 270 and sealing member 290 are shown. Each of FIGS. 8, 9, and 10 show a different potential default position of actuating beam 240. FIG. 8 shows a construction in which sealing member 290 is misaligned with orifice 260. As shown, an outer edge of sealing member 290 is disposed inward of a boundary of orifice 260. In other words, sealing member 290 does not completely cover orifice 260, and does not contact one side of valve seat 270. As a result, an opening 331 between sealing member 290 and valve seat 270 exists when actuating beam 240 is in its default position, leading to fluid leaks and diminishment in performance.

Thus, the cantilevered portion 308 of actuating beam 240 must be a proper length 312 such that sealing member 290 disposed at an end thereof covers the entirety of orifice 260. As such, the processes (e.g., back-etching of a double SOI wafer) used to shape actuating beam 240 and sealing member 290 must be precisely controlled to ensure an adequate seal. In some embodiments, such control is performed via application of an etching mask dimensioned to generate sealing member 290 that is precisely aligned with orifice 260.

FIG. 9 shows a situation in which actuating beam 240 is over-compressed onto valve seat 270. Such a situation may arise, for example, if tuning layer 244 is too thick, resulting in a compressive stress that over-curves actuating beam 240. As a result, a first side of sealing member 290 (e.g., a side opposite the spacing member 280) presses into valve seat 270, lifting a second side of the sealing member (e.g., a side proximate the spacing member 280) from the valve seat 270. This results in a gap 340 between sealing member and valve seat 270, leading to fluid leaks and diminished performance. FIG. 10, in contrast, illustrates a situation in which actuating beam 240 is properly constructed. As shown, actuating beam 240 is constructed such that a contact area between valve seat 270 and sealing member 290 is substantially maximized. In other words, an orifice-facing surface of sealing member 290 is roughly parallel to an upper surface of valve seat 270. Such a configuration ensures an adequate seal between actuating beam 240 and sealing member 290, which prevents evaporation of fluid contained in jetting assembly 200.

While FIG. 10 shows the actuating beam 240 extending roughly parallel to orifice plate 250, it should be understood that the configuration may differ from that shown in some embodiments. For example, in one embodiment, valve seat 270 is constructed from a compliant material (e.g., SU-8), and the actuating beam 240 is constructed such that sealing member 290 extends at a slight angle with respect to the orifice plate 250. The compliant nature of valve seat 270 allows for a distant end of sealing member 290 from the spacing member 280 to press slightly more into valve seat 270 than a proximate end while still maintaining an adequate seal. Moreover, the curvature of the actuating beam 240 presses sealing member 290 into valve seat 270 to enhance the seal formed at the interface in between. Accordingly, in some embodiments, the actuating beam 240 is constructed with a tuning layer 244 having a compressive stress that overcomes tensile strains produced by other layers (e.g., in the passivation structure 406) to induce a default curvature of actuating beam 240 towards orifice 260. Actuating beam 240 may be constructed to have a length based on the degree of default curvature such that the entirety of the opening in valve seat 270 is covered by sealing member 290.

Figure 11:
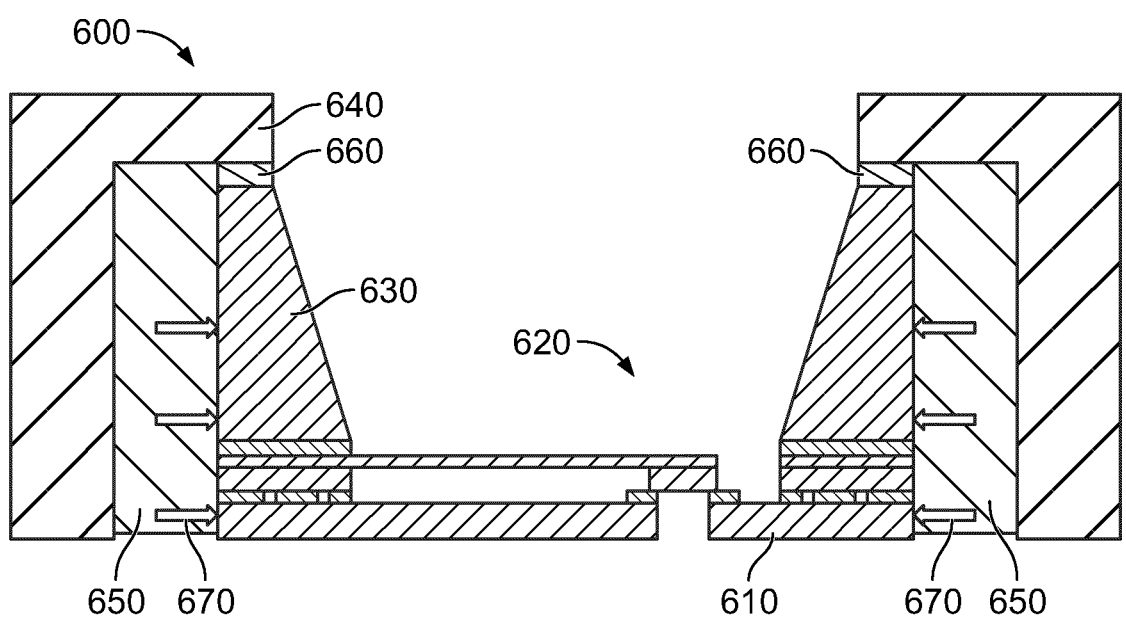
FIG. 11 is a cross-sectional view of a carrier and a portion of a micro-valve, according to an example embodiment.

Referring now to FIG. 11, a cross sectional view of a portion of a jetting assembly 600 is shown, according to an example embodiment. As shown, jetting assembly 600 includes an orifice plate 610 forming part of a micro-valve 620 (e.g., similar in structure to micro-valve 230). Micro-valve 620 is attached to an input fluid manifold 630 via an adhesive layer. Input fluid manifold 630 is coupled to a plastic carrier 640. Jetting assembly 600 may be similar in structure to jetting assembly 200 described with respect to FIG. 5A, with the exception that jetting assembly 600 does not include a structural layer disposed between input fluid manifold 630 and plastic carrier 640.

As shown, sidewalls of input fluid manifold 630 and micro-valve 620 are attached to inner surfaces of carrier 640 via a first carrier adhesive 650. For example, first carrier adhesive 650 may be applied to the side-walls and then dried once input fluid manifold 630 is disposed inside the carrier 640. An upper surface of input fluid manifold 630 may be attached to carrier 640 with a second carrier adhesive 660. In some embodiments, second carrier adhesive 660 is the same as first carrier adhesive 650, but just applied to carrier 640 at a different point in time.

Figure 12:
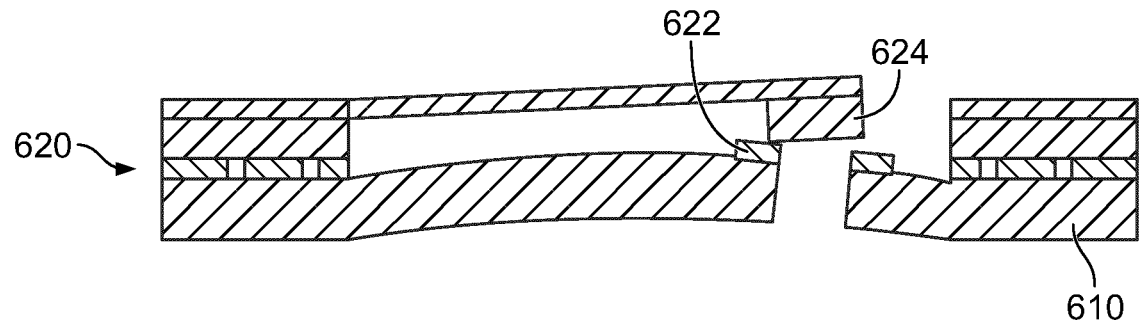
FIGS. 12, 13, and 14 are cross sectional views of an orifice plate and an actuating beam of a micro-valve, according to an example embodiment.
Figure 13:
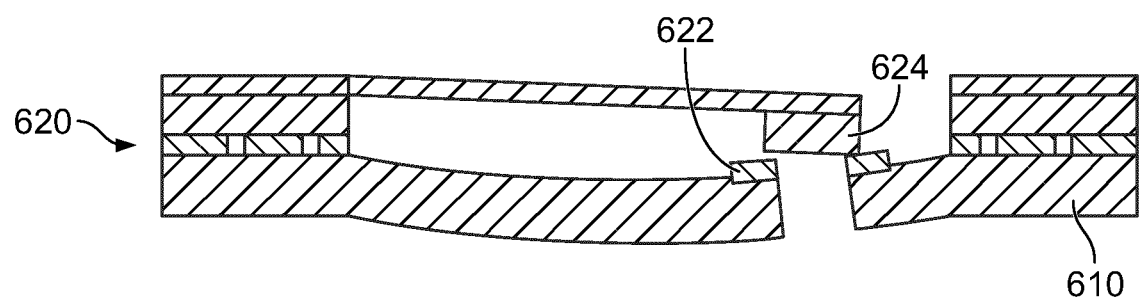
Figure 14:
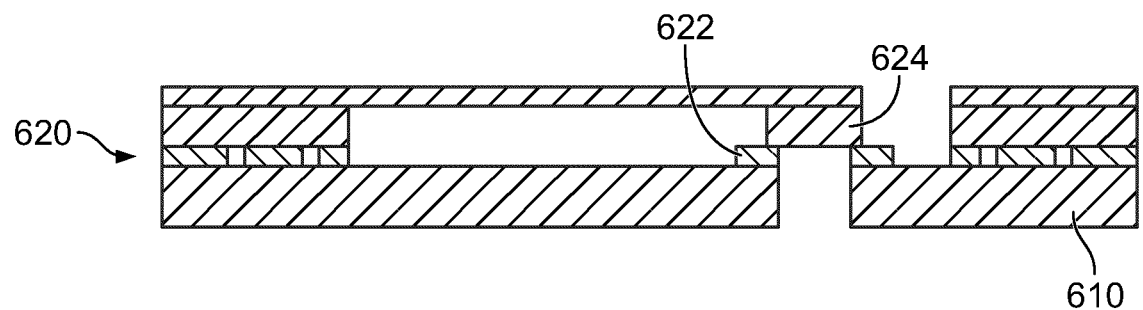

As indicated by arrows 670, first carrier adhesive 650 may introduce stress at various points along sidewalls of the input fluid manifold 630 and micro-valve 620. Such stress may result in certain structures being compressed and others being tensioned. FIGS. 12, 13, and 14 show various configurations of micro-valve 620 that may result from stresses induced by adhesives used to attach micro-valve 620 to a carrier. For example, FIG. 12 shows a situation where orifice plate 610 is "bowed in" as a result of compressive stress resulting from first carrier adhesive 650. As shown, the bowing of orifice plate 610 prevents a proper seal from being formed between a valve seat 622 and a sealing member 624 because the orifice is distorted due to the bowing. Leaking of fluid from an internal reservoir will result, leading to poor performance.

FIG. 13 shows an example in which the orifice plate 610 is "bowed out" as a result of compressive stress resulting from first carrier adhesive 650. Such bowing induces distortions into an orifice preventing sealing of the reservoir, resulting in diminishing performance. FIG. 14 shows a situation in which stresses induced by carrier adhesive 650 are minimized. As shown, such a configuration enables a proper seal to be formed between sealing member 624 and valve seat 622, and thus confers the various benefits described herein. In various embodiments, such a configuration may be achieved by positioning on an interposer (e.g., the structural layer 222 or interposer 222b) on an input fluid manifold, as previously described herein so as to provide sufficient rigidity and strength to the overall structure of the micro-valve and prevent bowing of the orifice plate.

Figure 15:
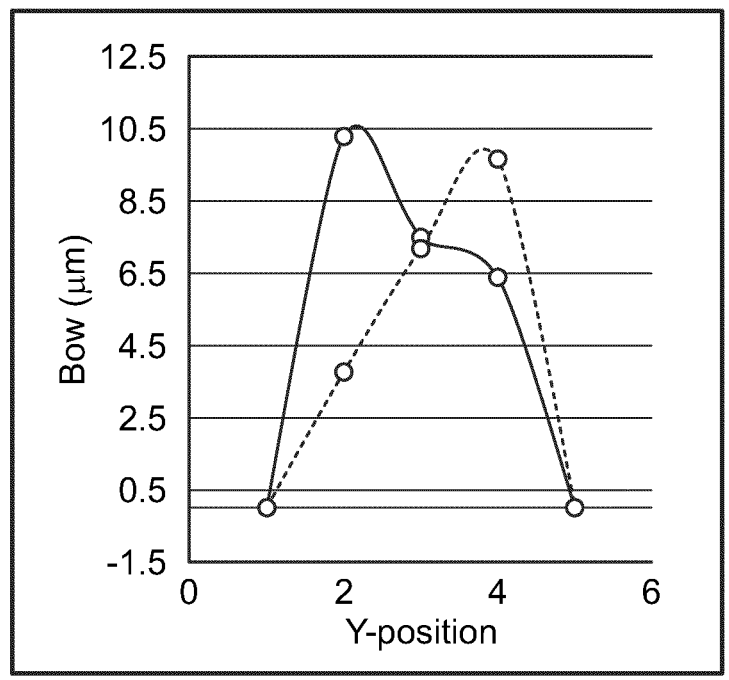
FIGS. 15 and 16 are charts showing bowing amounts of orifice plates of micro-valves, according to an example embodiment.
Figure 16:
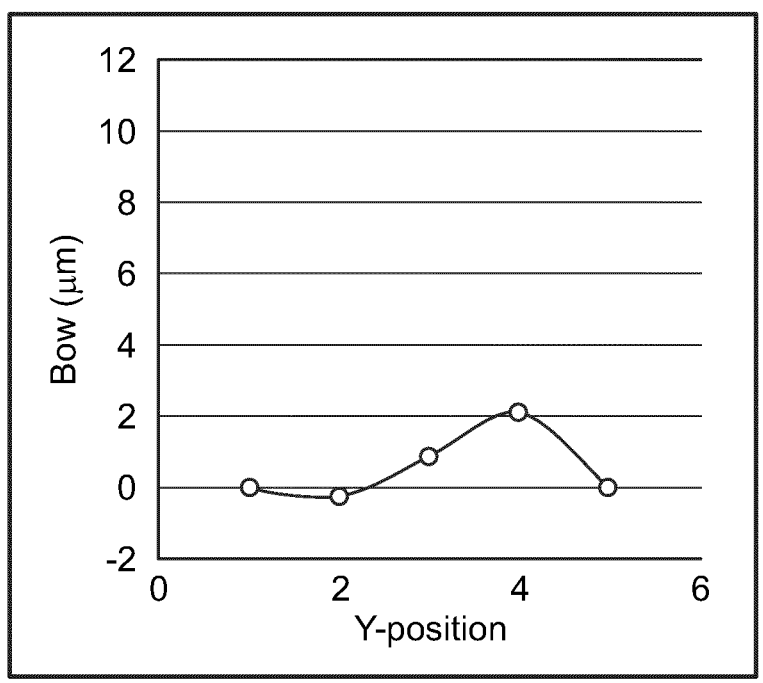

FIG. 15 is a chart showing bowing amounts of the orifice plate 610 with respect to position. As shown, the embodiment shown in FIG. 11 produces maximal bowing amounts of approximately 10 microns. Such an amount is suboptimal in that it completely prevents an adequate seal from being formed at the interface between valve seat 622 and sealing member 624. FIG. 16 is a chart showing bowing amounts of an orifice plate of an alternative embodiment to that shown in FIG. 11 (e.g., the jetting assembly 200, 200b described with respect to FIG. 5A, 5B). The jetting assembly measured to produce FIG. 16 differs from the jetting assembly 600 in that it further includes an interposer (e.g., similar to interposer 222b described with respect to FIGS. 5B and 6) disposed between the input fluid manifold and an external carrier. As shown, the orifice plate bows by no more than 2 microns across the entirety thereof. Such a limited amount of bowing enables a quality seal to be formed at the orifice. Thus, the addition of the interposer 222b significantly reduces bowing of the orifice plate resulting from external adhesives and facilitates proper functioning of the actuating beam 240 as described herein.

Figure 17:
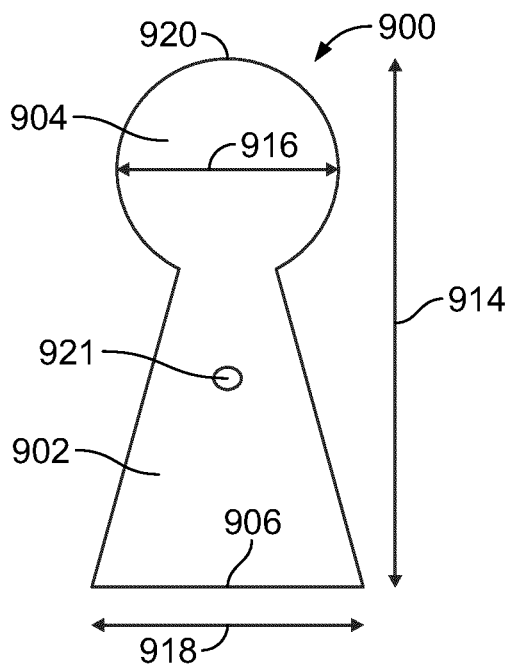
FIG. 17 is a plan view of an actuating beam of a micro-valve, according to an example embodiment.

Referring now to FIG. 17, a plan view of an actuating beam 900 of a micro-valve is shown, according to an example embodiment. Actuating beam 900 may be an example embodiment of the cantilevered portion 308 of the actuating beam 240 described with respect to FIG. 5A-B. For example, the portion of actuating beam 900 shown may extend as a cantilevered portion from a spacing member (such as spacing member 280) disposed underneath actuating beam 900. As such, actuating beam 900 may further include a rectangular (or any other suitable-shaped) supporting portion disposed on the spacing member to support the portion shown in FIG. 5A-5B. Additionally, actuating beam 900 may be constructed of a plurality of materials as described with respect to FIG. 7A-7B.

Figure 18:
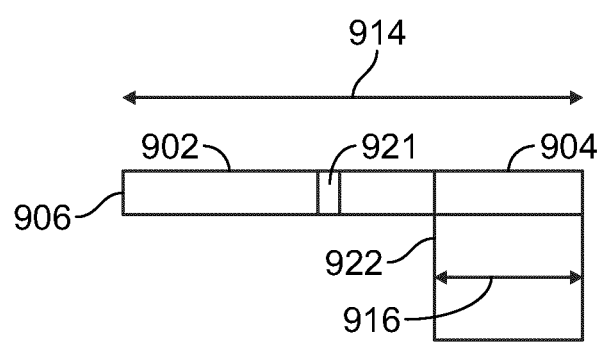
FIG. 18 is a side view of an actuating beam of a micro-valve, according to an example embodiment.

As shown in FIG. 17, actuating beam 900 includes an extending portion 902 and an overlapping portion 904. In various embodiments, actuating beam 900 extends a length 914 between a base 906 and a tip 920 of the overlapping portion 904, where the base 906 is located at the interior surface of the spacing member that defines a portion of the fluid cavity and the tip is the end of the beam 900 located distal from that surface. Extending portion 902 may be positioned relative to an orifice on an orifice plate such that extending portion 902 extends from the spacing member such that overlapping portion 904 covers the orifice. As shown, extending portion 902 decreases in width 918 with distance from the base 906. In other words, extending portion 902 is substantially trapezoid-shaped. Such a decreasing-width profile may improve frequency performance of actuating beam 900. Put differently, the trapezoid-shaped extending portion 902 facilitates actuating beam 900 oscillating at a greater frequency within a pressurized fluid than embodiments where an actuating beam is substantially rectangular-shaped because of a reduced surface area of a trapezoid as compared to a rectangle. In some embodiments, an opening 921 may be provided in the extending portion 902 of the actuating beam 900. Such an opening 921 may allow fluid to pass therethrough as the actuating beam 900 moves between the open and closed positions so as to reduce fluid resistance exerted by the fluid on the extending portion 902. This may allow the actuating beam 900 to be driven using a lower voltage or current, improve aerodynamics and extend a life of the actuation beam 900. While FIGS. 17 and 18 show a single opening provided in the extending portion 902, any number of openings in any suitable configuration may be provided on the extending portion 902.

Overlapping portion 904 extends from an opposing end of extending portion 902. Overlapping portion 904 may include a sealing member 922 disposed on an undersurface thereof. As shown, overlapping portion 904 is substantially circular-shaped. In some embodiments, a diameter 916 of overlapping portion 904 is approximately equal to a maximal width of extending portion 902 (e.g., at the base 906). In various alternative embodiment, overlapping portion 904 may have a diameter that is smaller or larger than the maximal width of extending portion 902. Overlapping portion 904 may be shaped to correspond to a shape of an orifice disposed beneath actuating beam 900. For example, in embodiments, where an orifice is circular, overlapping portion may be circular as well. Such an arrangement facilitates providing a sealing member on overlapping portion 904 that corresponds in shape to the orifice, which facilitates alignment therebetween and a seal between the sealing member and a valve seat disposed proximate to the orifice.

As will be appreciated, the size of overlapping portion 904 will affect various aspects of actuating beam 900's performance. For example, the size of overlapping portion 904 may impact the actuating beam 900's resonance frequency, which may be desirable to avoid in operating actuating beam 900 through application of electrical signals applied thereto. Additionally, too small of an overlapping portion 904 may prevent an adequately sized sealing member from properly attached thereto. Accordingly, overlapping portion 904 is sized with each of these various factors in mind.

It should be understood that alternative embodiments for actuating beams are envisioned. For example, in some embodiments, actuating beam 900 may be substantially rectangular-shaped and overlapping portion 904 may simply include an end of the extending portion 902. In other example embodiments, different combinations of shapes for extending portion 902 and overlapping portions may be used. In an example, extending portion 902 is rectangular-shaped, and overlapping portion 904 is as depicted in FIG. 5A-5B. Any combination of shapes may be utilized, with the understanding that alteration of the configuration will impact the frequency at which an including jetting assembly may operate and the overall performance of the jetting assembly may be adversely effected.

FIG. 18 shows a side view of the actuating beam 900, according to an example embodiment. As shown, a sealing member 922 is disposed on the overlapping portion 904. In the example shown, the sealing member 922 has a cross-sectional shape that corresponds to that of the overlapping portion 904. As such, sealing member 922 is substantially cylindrical-shaped and has a diameter 916 that corresponds to that of the overlapping portion 904. Such an implementation simplifies production of actuating beam 900, as a single etching mask may be used to form both sealing member 922 and the actuating beam 900. However, alternative embodiments are envisioned. For example, the sealing member 922 may have a smaller or larger diameter (or cross-sectional area) than overlapping portion 904, or be differently-shaped.

Figure 19:
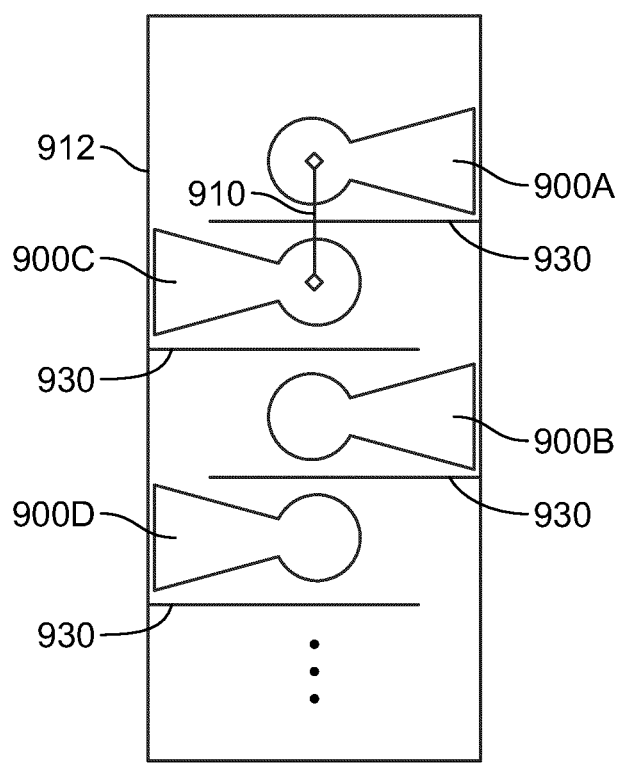
FIG. 19 is a plan view of a plurality of actuating beams of a jetting assembly, according to an example embodiment.

Referring now to FIG. 19, an arrangement of the actuating beams 900A, 900B, 900C, and 900D is shown, according to an example embodiment. In an example, each of the actuating beams 900A, 900B, 900C, and 900D is similar in structure to the actuating beam 900 described with respect to FIG. 17. As shown, each of the actuating beams 900A, 900B, 900C, and 900D extend inward of a boundary 912 defined by the jetting assembly into which they are disposed. For example, boundary 912 may be defined by an input fluid manifold (e.g., by a channel such as the first channel 212 described with respect to FIG. 5A) or inner edges of spacing members. In the example shown, a first set of actuating beams 900A and 900B extends from a first side of boundary 912 and a second set of actuating beams 900C and 900D extends from a second side of the boundary 912. The actuating beams 900A and 900B of the first set interleave the actuating beams 900C and 900C of the second set to create an interdigitated set of actuating beams 900. In some embodiments, walls 930 may be positioned between each of the adjacent actuating beams 900A-D, for example, protrude part way or complete in an input fluid manifold in which the actuating beams 900A-D are positioned. The walls 930 may serve to at least partially fluidly isolate the adjacent actuating beams 900A-D from each other so as to substantially reduce fluidic cross-talk between adjacent actuating beams 900A-D In some embodiments, the plurality of actuating beams 900A, 900B, 900C, and 900D is an equally-spaced set such that centers of one of actuating beams 900A, 900B, 900C, and 900D is separated from a center of an adjacent one of actuating beams 900A, 900B, 900C, and 900D by a predetermined distance 910. In some embodiments, the predetermined distance 910 is approximately 128 microns. The interdigitated set of actuating beams 900A, 900B, 900C, and 900D may include any number of beams, for example, 16, 24, 52 or any other number of beams. In particular embodiments, the interdigitates set of actuating beams 900A, 900B, 900C and 900C may include 52 actuating beams 900 such that the jetting assembly includes 52 micro-valves such as the one disclosed with respect to FIG. 5A-B. For example, each of the actuating beams 900A, 900B, 900C, and 900D may include a sealing member extending therefrom to contact valve seats disposed at a plurality of orifices in an underlying orifice plate. As such, the plurality of orifices may be arranged linearly with centers of the orifices separated from one another by exactly or approximately the predetermined distance 910. In other embodiments, the actuating beams 900A, 900B, 900C and 900D may be arranged in a linear array, a circular array, a semi-circular array, a polygonal array, an elliptical array, an asymmetric array or any other suitably shaped array.

Alternative arrangements of actuating beams 900A, 900B, 900C, and 900D are envisioned. For example, in one embodiment, every actuating beam 900 may extend from a single side of boundary 912. The arrangement shown in FIG. 19 is beneficial over such an arrangement, however, because the arrangement shown in FIG. 19 allows for actuating beams 900 to be spaced closer together (e.g., due to additional clearance at the boundary 912). Such close-spacing facilitates including a greater number of micro-valves being disposed in a resulting jetting assembly, and provides higher resolution prints (e.g., in terms of dots per inch).

Figure 20:
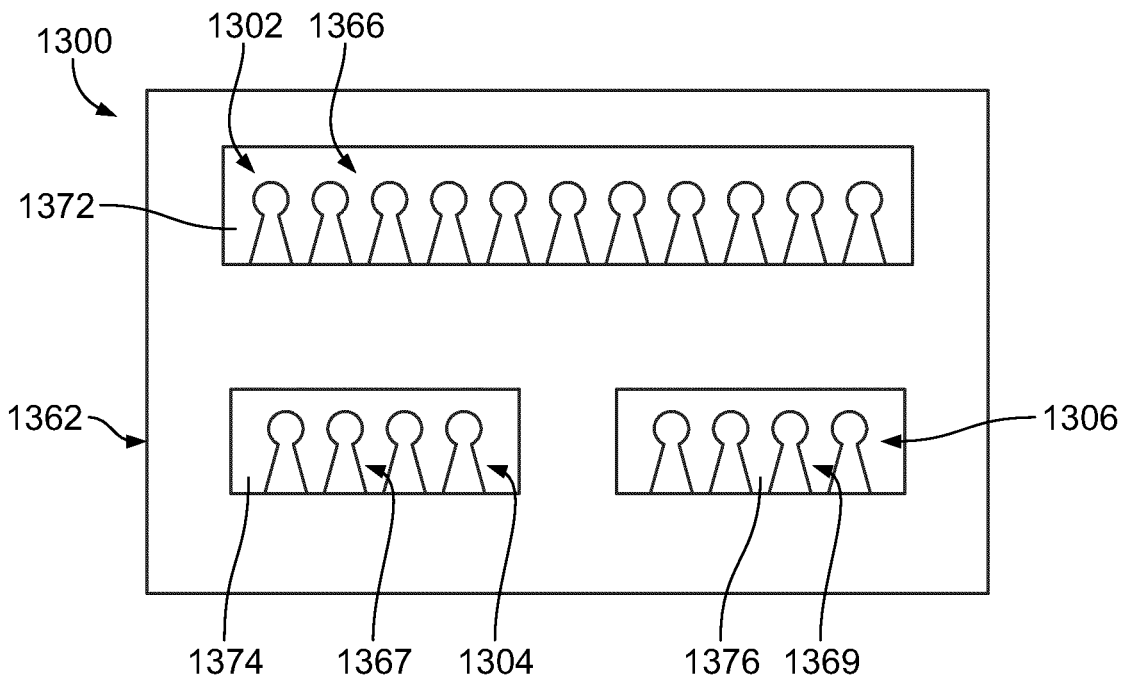
FIG. 20 is a top view of an input fluid manifold of a jetting assembly including a plurality of fluid plenums, according to an example embodiment.
Figure 21:
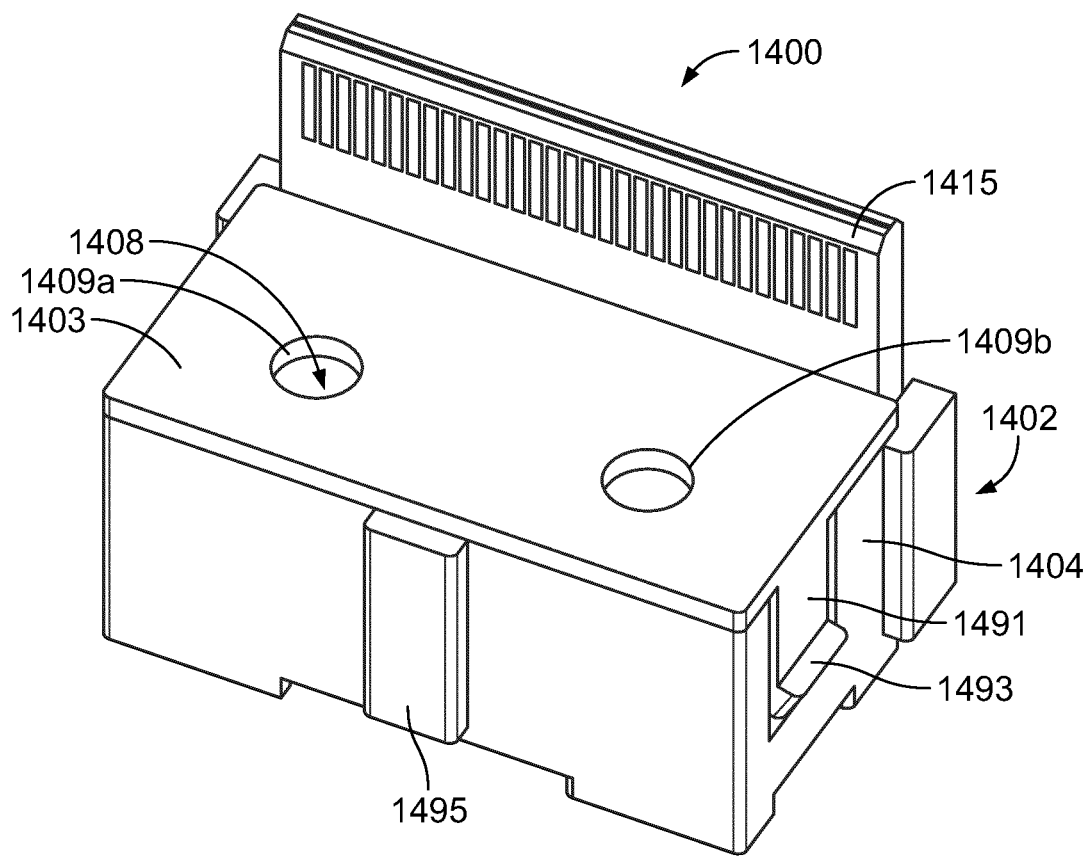
FIG. 21 is a rear perspective view of a jetting assembly, according to an example embodiment.
Figure 22:
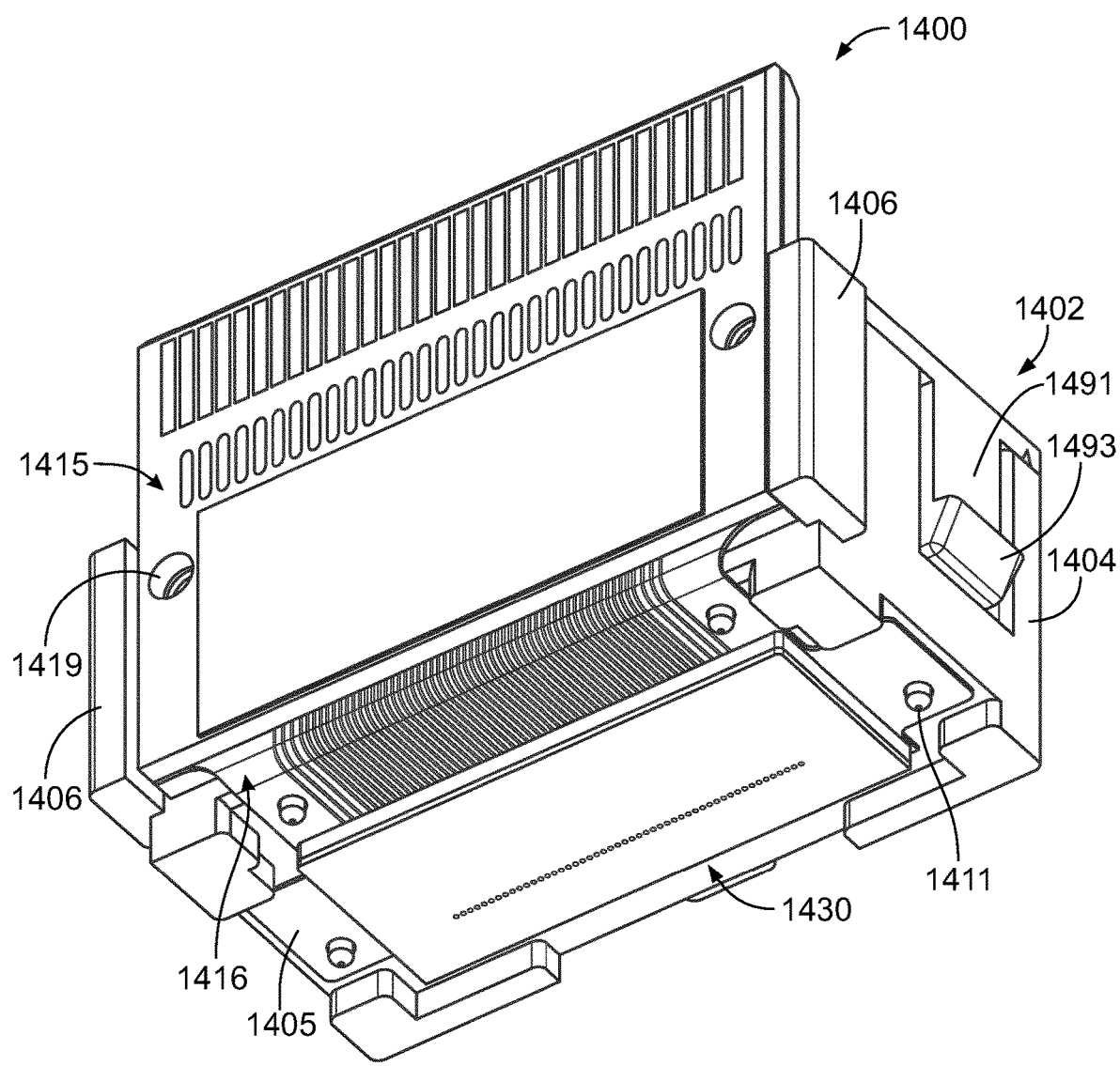
FIG. 22 is a front perspective view of the jetting assembly of FIG. 21.

In some embodiments, an input fluid manifold may be configured to define a plurality of fluid plenums or reservoirs such that each of the at least one fluid plenum corresponds to at least a portion of a plurality of micro-valves included in a jetting assembly. Referring now to FIG. 20, a top cross-sectional view of a valve body 1300 which may be included in a jetting assembly is shown, according to an example embodiment. The valve body 1300 includes an input fluid manifold 1362 includes, a first set of micro-valves 1302, a second set of micro-valves 1304 and a third set of micro-valves 1306. The input fluid manifold 1362 defines a first opening 1372, a second opening 1374 and a third opening 1376. The first opening 1372 exposes the first set of micro-valves 1302 to form a first fluid plenum 1366, the second opening 1374 exposes the second set of micro-valves 1304 to form a second fluid plenum 1367 and the third opening 1376 exposes the third set of micro-valves 1306 to form a third fluid plenum 1369. The first fluid plenum 1366 may be configured to hold a first fluid (e.g., yellow ink) received from a first fluid supply. The second fluid plenum 1367 may be configured to include a second fluid (e.g., cyan ink) different from the first fluid which may also be received from the first fluid supply or a separate fluid supply. Similarly, the third fluid plenum 1369 may be configured to hold a third fluid (e.g., magenta ink) different from each of the first and second fluids which may be received from the first fluid supply or a separate fluid supply. In this manner, the input fluid manifold 1362 may allow each of the sets of micro-valves 1302, 1304 and 1306 to communicate different fluids (e.g., different colored inks) to a target. It should be appreciated that while FIG. 20 shows a particular embodiment of the input fluid manifold 1362 including three fluid plenums 1366, 1367 and 1369, in other embodiments, an input fluid manifold may include any number of fluid plenums which may be arranged in any suitable configuration.

Figure 25:
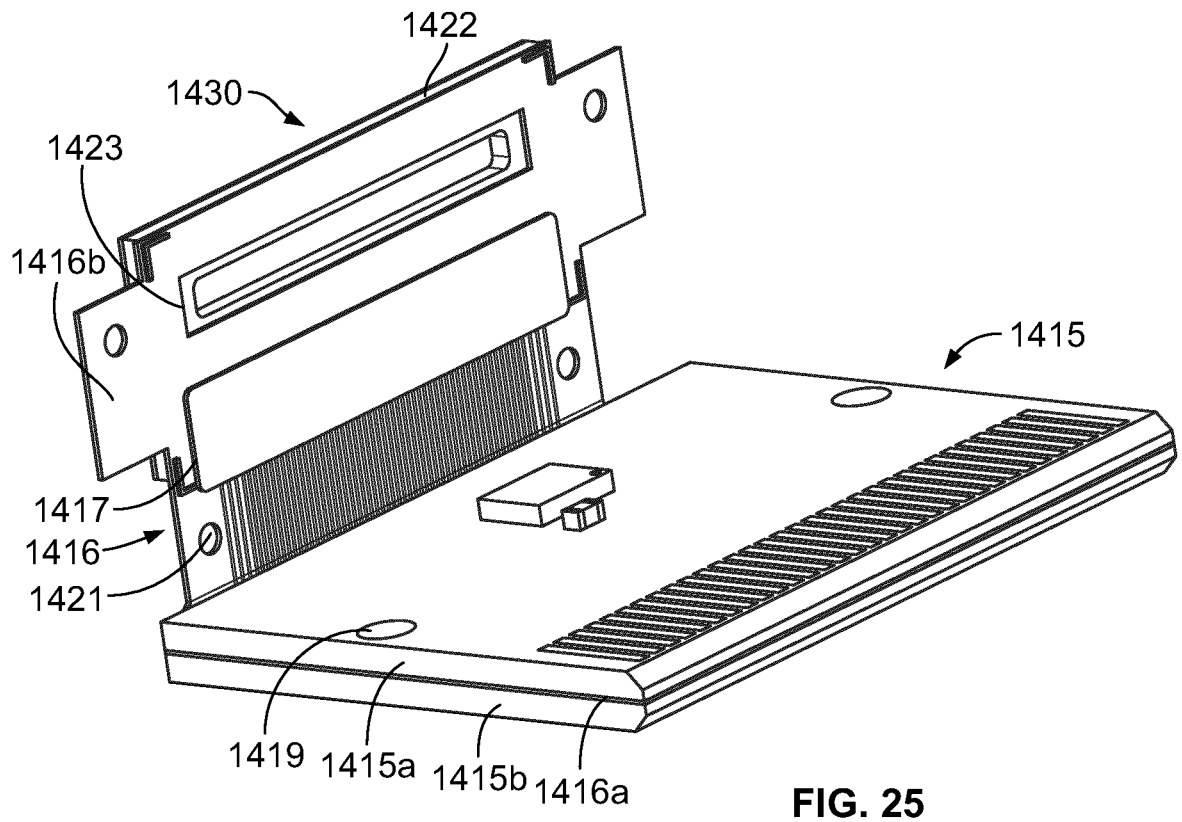
FIG. 25 is a perspective view of a printed circuit board (PCB) and a flex circuit coupled to a micro-valve included in the jetting assembly of FIG. 21-22, according to an embodiment.

In some embodiments, movement or vibration of the actuating beams of the various micro-valves described herein may cause acoustic resonance which can contribute to noise. In some embodiments, carriers for use in jetting assemblies may include features structured to reduce acoustic resonance generated by the actuating beams. For example, referring to FIGS. 21-25 a jetting assembly 1400 is shown, according to another embodiment. The jetting assembly 1400 includes a carrier 1402 and a micro-valve 1430 coupled to the carrier 1402 via an interposer 1422 (FIG. 25). The micro-valve 1430 and the interposer 1422 may be substantially similar to the micro-valve 230, 230b and the interposer 222b, respectively and therefore, not described in further detail herein.

Figure 23:
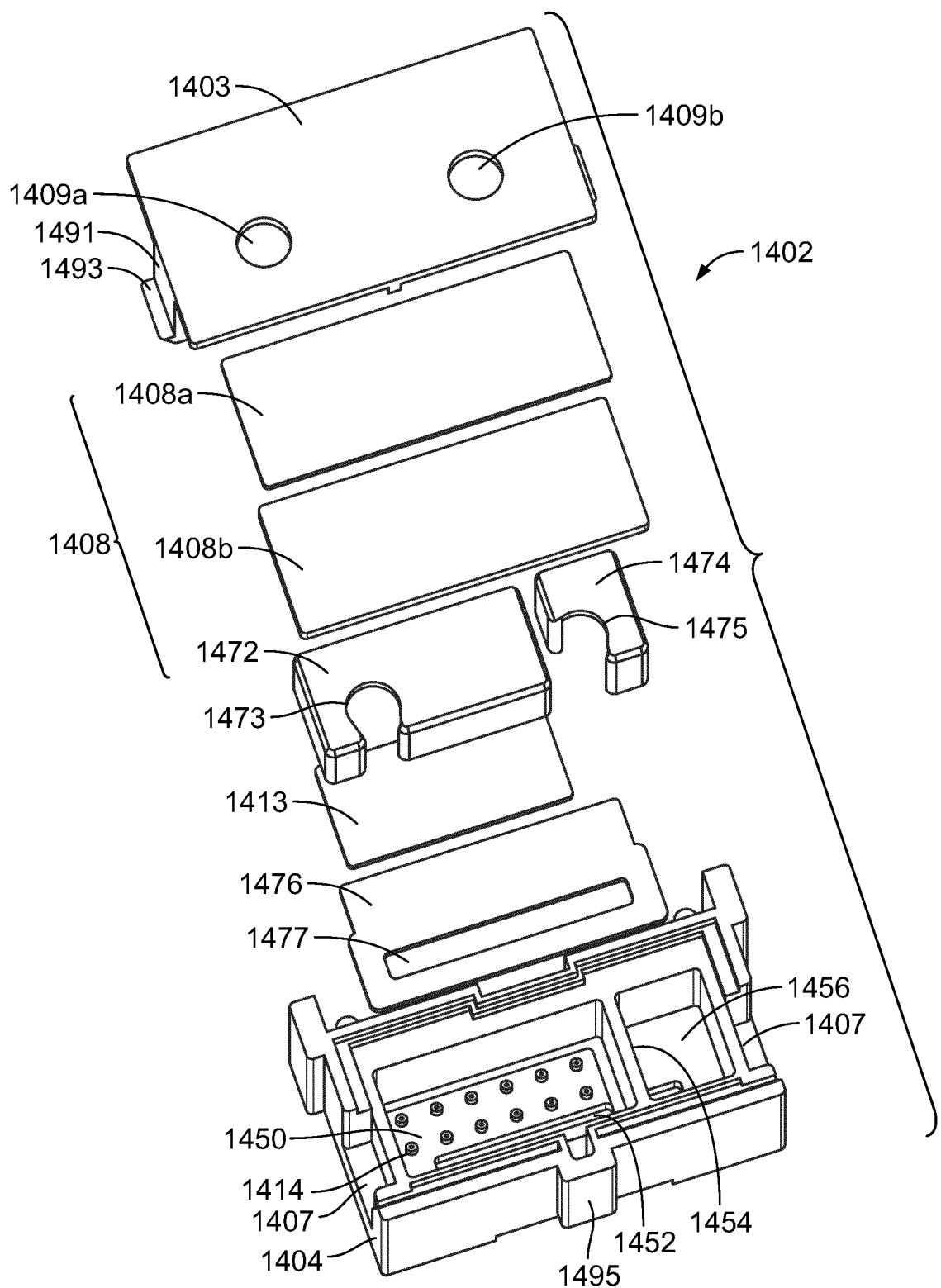
FIG. 23 is an exploded view of a carrier included in the jetting assembly of FIG. 21, according to an embodiment.
Figure 24:
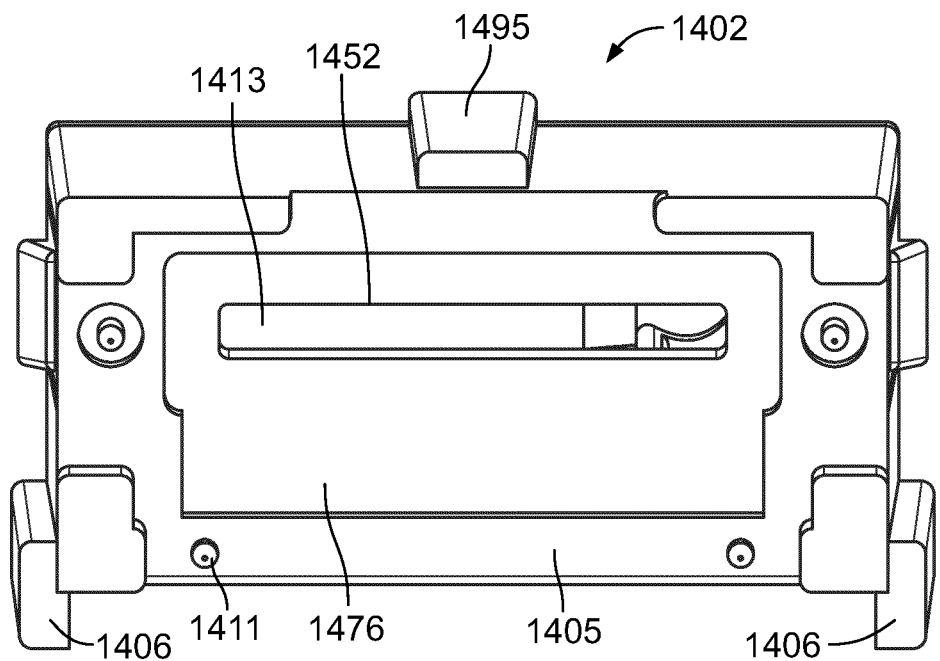
FIG. 24 is a front view of the carrier of FIG. 23.

FIG. 23 shows an exploded view of the carrier 1402. The carrier 1402 includes a plurality of carrier sidewalls 1404 and a carrier base 1405, which together define an internal volume of the carrier 1402. The carrier 1402 may be formed from plastics, polymers, metals, any other suitable material or a combination thereof. In some embodiments, the carrier 1402 may be molded (e.g., injection blow molded) from a plastic material. In particular embodiments, at least the outer surfaces of the carrier sidewalls 1404 and the carrier base 1405 may be polished, for example, via sand blasting or bead polishing, such that the outer surfaces still retain sufficient roughness for an adhesive to form a strong bond thereon.

As shown in FIG. 23, the internal volume defined by the carrier 1402 is divided into a carrier inlet reservoir 1450 and a carrier outlet reservoir 1456 by a central wall 1454 disposed within the internal volume defined by the carrier 1402. The carrier inlet reservoir 1450 is configured to receive fluid from a fluid source through a cover 1403 which is coupled to the carrier 1402, and the carrier outlet reservoir 1456 is configured to receive fluid from the micro-valve 430, and return fluid to the fluid source through the cover 1403. A single longitudinal slot 1452 is defined in the carrier base 1405 and extends beneath the central wall 1454 from the carrier inlet reservoir 1450 to the carrier outlet reservoir 1456. A first portion of the slot 1452 located in the carrier inlet reservoir 1450 is structured to allow fluid to be delivered to an input fluid manifold of the micro-valve 1430 through the interposer 1422, as previously described herein, and a second portion of the slot 1452 located in the carrier outlet portion 1456 is configured to receive the fluid from the micro-valve 1430 through the interposer 1422. A first adhesive layer 1476 may be disposed on an outer surface of the carrier base 1405, i.e., below the carrier base 1405 (shown above the carrier 1402 in FIG. 23 for clarity) and configured to bond the interposer 1422 and, in some embodiments, a portion of a flex circuit 1416 (FIGS. 21, 22 and 25) coupled to the micro-valve 1430 to the outer surface the carrier base 1405. A plurality of first alignment protrusions 1411 extend from an outer surface of the carrier base 1405 and are configured to mate with corresponding flex circuit alignment throughholes 1421 to allow alignment of the flex circuit 1416 and thereby, the micro-valve 1430 on the carrier base 1405. The first adhesive layer 1476 defines a first adhesive layer slot 1477 corresponding to the slot 1452. The slot 1452 may serve as a frequency damper, damping acoustic resonance produced due to the vibration of the actuating beams included in the micro-valve 1430.

A filter layer 1413 configured to filter particles that may be present in the fluid before the fluid flows into the micro-valve 1430, is disposed on an inner surface of a portion of the carrier base 1405 that forms a base of the carrier inlet reservoir 1450. The filter layer 1413 may be coupled to the inner surface of the carrier base 1405 via an adhesive, fusion bonding or heat staked thereon. In some embodiments, a plurality of bonding protrusions or standoffs 1414 may be disposed on the inner surface of the portion of the carrier base 1405 and configured to space the filter layer 1413 from the inner surface and/or facilitate bonding of the filter layer 1413 to the inner surface of the carrier base 1405.

A notch 1407 is defined on each of a first set of the sidewalls 1404 and configured to receive cover alignment arms 1491 that protrude from corresponding edges of the cover 1403 towards the carrier 1402. Furthermore, a carrier alignment detent 1495 is also defined on one of the sidewalls 1404 that is perpendicular to the first set of the sidewalls 1404, and may be configured to slide into a mating slot defined in a holder (e.g., the holder 150) configured to receive the jetting assembly 1400. Moreover, a pair of alignment arms 1406 extend from edges the first set of the sidewalls 1404 located distal from the carrier alignment detent 1495 in a direction away from the carrier 1402. The pair of alignment arms 1406 define a receiving space therebetween perpendicular to the carrier base 1405 that is sized and shaped to receive a printed circuit board (PCB) 1415 electrically coupled to the micro-valve 1430 via the flex circuit 1416. The alignment arms 1406 facilitate alignment of the PCB 1415 on the carrier 1402. In some embodiments, PCB alignment protrusions (not shown) may extend from the sidewall 1404 of the carrier 1402 on which the PCB 1415 is disposed, and are configured to be inserted into corresponding PCB alignment throughholes 1419 defined in the PCB 1415, so as to facilitate positioning of the PCB 1415 on the corresponding sidewall 1404 at a predetermined location.

The cover 1403 is coupled to the carrier 1402, for example, via an adhesive, fusion bonding, or heat staked thereto. The cover 1403 defines a cover inlet 1409*a* through which fluid is delivered into the carrier inlet reservoir 1450, and a cover outlet 1409*b* configured to receive fluid from the carrier outlet reservoir 1456 after circulating through the micro-valve 1430. As described previously, the cover alignment arms 1491 protrude from corresponding edges of the cover 1403 towards the carrier 1402 and are inserted into a corresponding notch 1407 defined on a corresponding sidewall 1404 of the carrier 1402. Each cover alignment arm 1491 includes a ledge 1493 defined on an axial end thereof distal from the cover 1403 and extending away from the corresponding sidewall 1404 of the carrier 1402. Each ledge 1493 may be configured to be seated in a corresponding groove defined in the holder so as to removably secure the jetting assembly 1400 to the holder, for example, snap-fit thereto.

A septum layer 1408 is disposed beneath the cover 1403 such, for example, within a corresponding groove defined in the carrier 1402 proximate to the cover 1403. The septum layer 1408 may be compressed between the cover 1403 and carrier 1402 to secure the septum layer 1408 in place. The septum layer 1408 includes a sheet formed from a compliant material, which is disposed across the carrier inlet reservoir 1450 and the carrier outlet reservoir 1456. In some embodiments, the septum layer 1408 may comprise a two-layer structure having a first layer 1408*a* (e.g., a Teflon® layer) coated on a second thicker layer (e.g., a butyl layer). As previously described herein with respect to the jetting assembly 200*b*, insertion needles (e.g., the insertion needles 12*a*/12*b*) may be inserted through the portion of the septum layer 1408 located below the cover inlet 1409*a* and the cover outlet 1409*b* to allow fluid to be inserted into the carrier inlet reservoir 1450, or be drawn out of the carrier outlet reservoir 1456.

A first septum support insert 1472 is disposed in the carrier inlet reservoir 1450 and may be sized and shaped to be snugly fit therein such that sidewalls of the first septum support insert 1472 define at least a portion of perimetral boundaries of the carrier inlet reservoir 1450, and a roof of the first septum support insert 1472 forms a roof of the carrier inlet reservoir 1450. A first septum support insert opening 1473 is formed in the roof of the first septum support insert 1472 and is axially aligned with the cover inlet 1409*a*. The roof of the first septum support insert 1472 supports an area of the septum layer 1408 located around the carrier inlet 1409*a* disposed within the carrier inlet reservoir 1450, and prevents the septum layer 1408 from collapsing due to force of an insertion needle being inserted through the portion of the septum layer 1408 disposed below the cover inlet 1409*a*. The first septum support insert opening 1473 allows the insertion needle to be inserted into the carrier inlet reservoir 1450 so as to be in fluid communication with the internal volume thereof.

Furthermore, a second septum support insert 1474 is disposed in the second carrier outlet reservoir 1456 and is sized and shaped to snugly fit therein such that sidewalls of the second septum support insert 1474 define at least a portion of a perimetral boundaries of the carrier outlet reservoir 1456, and a roof of the second septum support insert 1474 forms a roof of the carrier outlet reservoir 1456. A second septum support insert opening 1475 is formed in the roof of the second septum support insert 1474 and is axially aligned with the cover outlet 1409*b*. The roof of the second septum support insert 1474 supports an area of the septum layer 1408 located around the carrier outlet 1409*b* disposed within the carrier outlet reservoir 1456 to prevent the septum layer 1408 from collapsing similar to the first septum support insert 1472.

FIG. 25 shows the PCB 1415, the flex circuit 1416 coupled to the PCB 1415, and the micro-valve 1430 coupled to the flex circuit 1416 via the interposer 1422. As previously, described herein, the PCB 1415 is disposed on a sidewall 1404 of the carrier 1402 and may be coupled thereto via an adhesive. In some embodiments, the PCB 1415 includes a first PCB layer 1415*a* and a second PCB layer 1415*b*. A flex circuit first coupling portion 1416*a* of the flex circuit 1416 is disposed between the first and second PCB layers 1415*a/b* and may include electrical connectors (e.g., bonding pads) electrically coupled to corresponding connectors provided in the PCB 1415. Each PCB layer 1415*a/b* is bonded to the flex circuit first coupling portion 1416*a*, for example, via an adhesive such that the flex circuit first coupling portion 1416*a* is secured therebetween.

The flex circuit 1416 is bent around an edge of the sidewall 1404 on which the PCB 1415 is disposed such that a flex circuit second coupling portion 1415*b* that is disposed on the carrier base 1405 and bonded thereto, as previously described herein. The micro-valve 1430 is bonded to the flex circuit second coupling portion 1415*b* via the interposer 1422 and electrically coupled thereto, as previously described herein. An aperture 1423 is defined in the flex circuit second coupling portion 1415*b*. The aperture 1423 corresponds to, and is axially aligned with an opening defined in the interposer 1422 as well as the slot 1452 so as to allow the carrier 1402 to be fluidly coupled to the micro-valve 1430 therethrough. An identification tag 1417 is disposed between the flex circuit second coupling portion 1416*b* and the carrier base 1405, and secured therebetween.

Figure 26:
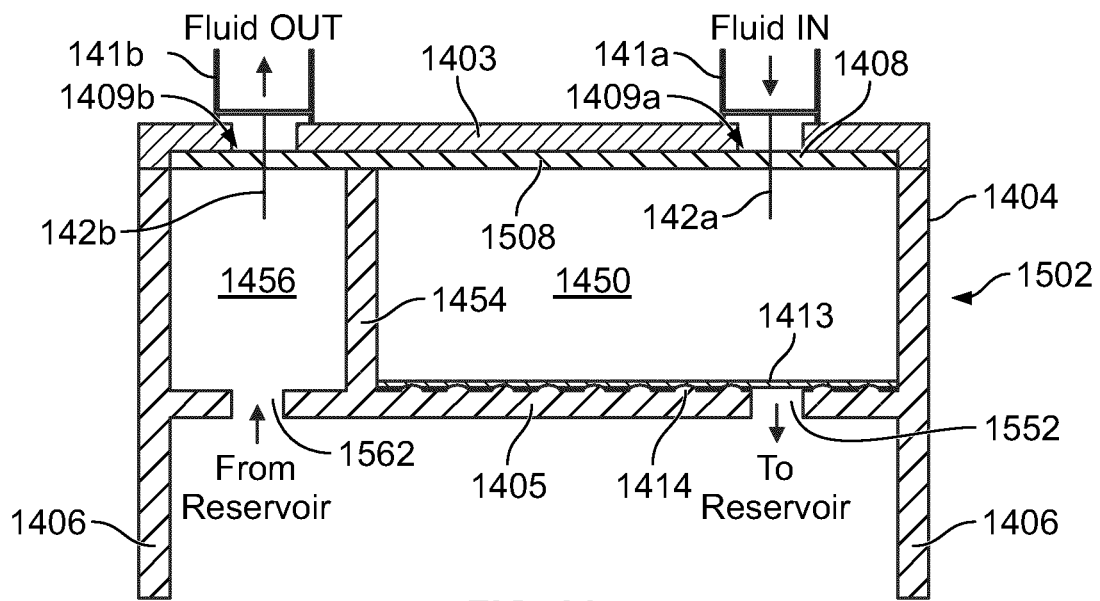
FIG. 26 is a schematic illustration showing a side cross-section view of a carrier that may be used in a jetting assembly, according to an embodiment.

In various embodiments, instead of a single longitudinal slot, a carrier for a jetting assembly may include other configurations of carrier inlet and outlets to provide fluid communication with an associated micro-valve, while providing acoustic resonance dampening. For example, FIG. 26 is a side cross-section view of a carrier 1502 for use in a jetting assembly, according to another embodiment. Similar to, the carrier 1402, the carrier 1502 includes the plurality of sidewalls 1404 and the carrier base 1405. The internal volume of the carrier 1502 is divided in into the carrier inlet reservoir 1450 and the carrier outlet reservoir 1456 by the central wall 1454. The pair of alignment arms 1406 extend from the sidewalls 1404. The plurality of bonding protrusions 1414 extend into the carrier inlet reservoir 1450 from the carrier base 1405, and the filter layer 1413 is disposed on the plurality of bonding protrusions 1414 and bonded thereto. The cover 1403 is coupled to the carrier 1502, and the septum layer 1408 is interposed therebetween. A first fluid connector 141*a* is coupled to the cover inlet 1409*a* and a first insertion needle 142*a* extending from the first fluid connector 141*a* is inserted through the septum layer 1408 into the carrier inlet reservoir 1450 to deliver fluid thereto. Moreover, a second fluid connector 141*b* is coupled to the cover outlet 1409*b* and a second insertion needle 142*b* extending from the second fluid connector 141*b* is inserted through the septum layer 1408 into the carrier outlet reservoir 1456 and configured to draw fluid therefrom.

Figure 27:
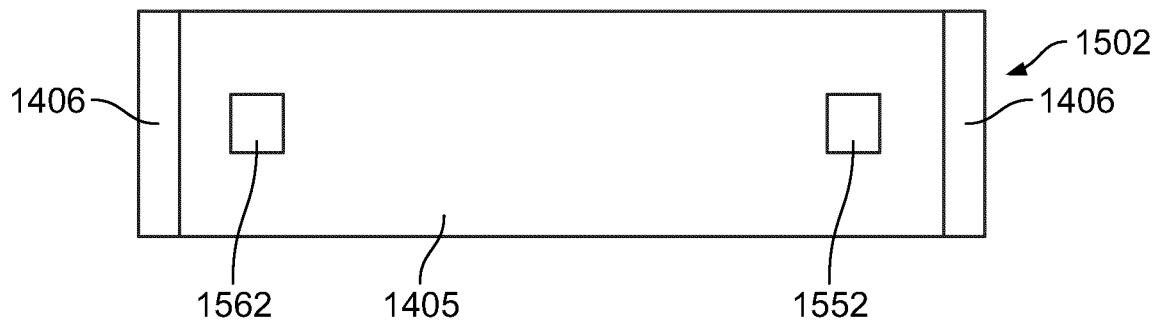
FIG. 27 is a front view of a carrier that may be used in a jetting assembly, according to another embodiment.

FIG. 27 is a front view of the carrier 1502. Different from the carrier 1402, the carrier 1502 includes a carrier outlet 1552 defined in a portion of the carrier base 1405 corresponding to the carrier inlet reservoir 1450, and structured to communicate the fluid from the carrier 1502 to the micro-valve (e.g., the micro-valve 230, 230*b*, 1430). A carrier inlet 1562 is also defined in a portion of the carrier base 1405 corresponding to the carrier outlet reservoir 1456 and structured to allow fluid from the micro-valve to enter the carrier outlet reservoir 1456.

Figure 28:
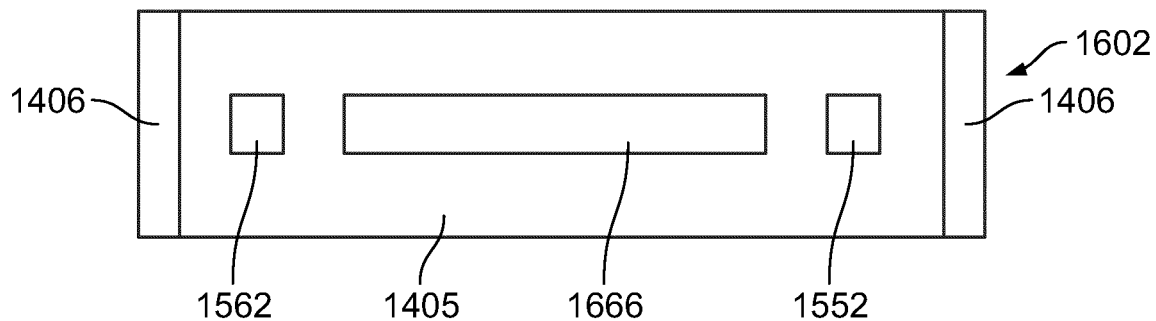
FIG. 28 is a front view of a carrier that may be used in a jetting assembly, according to yet another embodiment.

FIG. 28 is a front view of a carrier 1602, according to another embodiment. The carrier 1602 is similar to the carrier 1502 with the difference that a longitudinal slot 1666 is defined through the carrier base 1405 between the carrier outlet 1552 and the carrier inlet 1562. The longitudinal slot 1666 may only be provided in the carrier inlet reservoir 1450 or also extend into the carrier outlet reservoir 1456.

Figure 29:
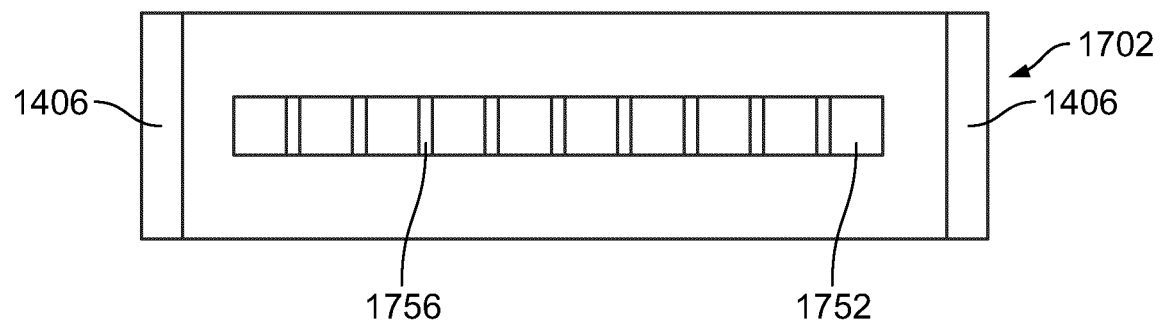
FIG. 29 is a front view of a carrier that may be used in a jetting assembly, according to yet another embodiment.

FIG. 29 is a front view of a carrier 1702, according to yet another embodiment. The carrier 1702 is similar to the carrier 1402 and includes a longitudinal slot 1752 defined in the carrier base 1405. However, a plurality of struts 1756 are disposed at predetermined intervals across a length of the longitudinal slot 1752, thereby dividing the slot 1752 into a plurality of openings extending from the carrier inlet reservoir 1450 to the carrier outlet reservoir 1456.

Figure 30:
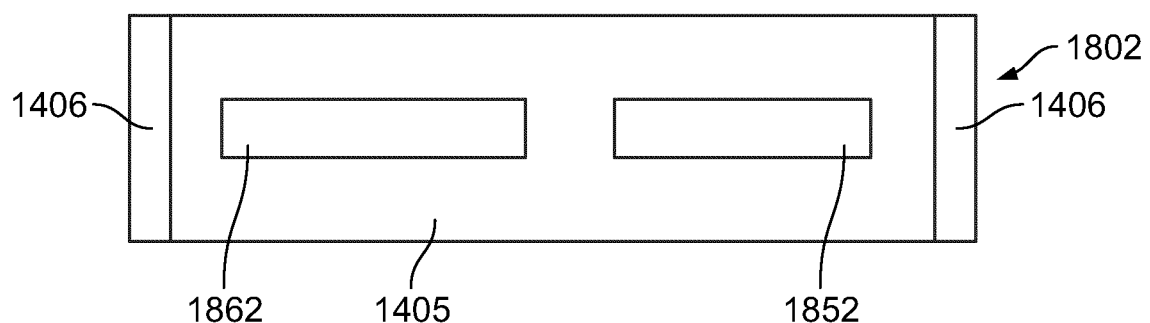
FIG. 30 is a front view of a carrier that may be used in a jetting assembly, according to yet another embodiment.

FIG. 30 is a front view of a carrier 1802, according to still another embodiment. Different from the carrier 1402, the carrier 1802 includes a first longitudinal slot 1852 defined in a portion of the carrier base 1405 corresponding to the carrier inlet reservoir 1450. Furthermore, a second longitudinal slot 1862 is defined in a portion of the carrier base 1405 corresponding to the carrier outlet reservoir 1456.

Figure 31:
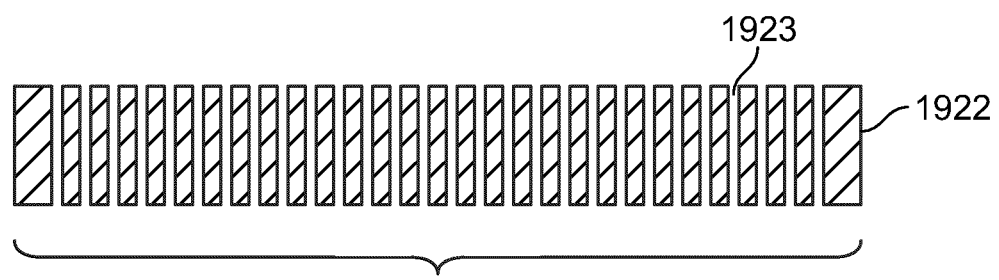
FIG. 31 is a side cross-section view of an interposer that may be used in a jetting assembly, according to an embodiment.

In some embodiments, an interposer for coupling a micro-valve to a jetting assembly may be configured to also serve as a filter. For example, FIG. 31 is a side cross-section view of an interposer 1922, according to an embodiment. The interposer 1922 may be used to couple the micro-valve 230, 230*b*, 1430*b* or any other micro-valve described herein to a carrier (e.g., the carrier 202, 202*b*, 1402, 1502, 1602, 1702, 1802 or any other carrier described herein). Instead of slots or apertures being defined in the interposer 1922 for communication of fluid from the carrier to the micro-valve, the interposer 1922 includes a plurality of pores 1923 defined therethrough. In some embodiments, the interposer 1922 may be formed from silicon and the plurality of pores 1923 may be formed via a deep reactive ion etching (DRIE) process. The pores 1923 may have a cross-sectional dimension in the micrometer or nanometer range and are configured to filter particles out of the fluid as it passes from the carrier into the micro-valve through the interposer 1922. In embodiments in which the interposer 1922 is used, the interposer 1922 also serves as a filter layer which may obviate the use of a separate filter layer within the carrier 1402, or provide an additional filtering stage to remove any particles that may have passed through the primary filter.

In some embodiments, a micro-valve comprises: an orifice plate including a first surface and a second surface, the orifice plate comprising an orifice extending from the first surface to the second surface; a spacing member disposed on the first surface, the spacing member offset from the orifice; a valve seat disposed on the first surface, wherein the valve seat defines an opening in fluid communication with the orifice and a fluid plenum; an actuating beam disposed on the spacing member, wherein the actuating beam extends from the spacing member toward the orifice, wherein the actuating beam comprises a layer of piezoelectric material, the actuating beam movable between a closed position and an open position by applying an electrical signal to the layer of piezoelectric material; and a sealing member affixed to an end portion of the actuating beam; wherein, when the layer of piezoelectric material does not have an electrical signal applied thereto, the actuating beam is in the closed position, a sealing surface of the sealing member contacts the valve seat to close the micro-valve.

In some embodiments, the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the valve seat so as to fluidly seal the orifice. In some embodiments, the spacing member and the sealing member have substantially the same thickness. In some embodiments, in the absence of the electrical signal, the predetermined turning stress is configured to cause the actuating beam to curve towards the orifice such that in the absence of the valve seat, the sealing surface would be positioned a predetermined distance beneath a lower surface of the spacing member. In some embodiments, the tuning layer is composed of at least one of silicon dioxide or silicon nitride.

In some embodiments, each of the non-active portion, the spacing member, and the sealing member are formed from the same material. In some embodiments, the actuation portion comprises two electrode portions, one located on a first side and the other located on an opposite side of the layer of piezoelectric material, and wherein each electrode portion comprise a conductive layer. In some embodiments, each electrode portion also comprises an adhesion layer. In some embodiments, the adhesion layer comprises titanium and the conductive layer comprises platinum disposed on the titanium.

In some embodiments, the actuating beam further comprises a passivation structure disposed on at least one of the electrode portions. In some embodiments, the passivation structure comprises an aluminum oxide layer, a silicon dioxide layer disposed on the aluminum oxide layer, and a silicon nitride layer disposed on the silicon dioxide layer.

In some embodiments, the at least one layer of piezoelectric material comprises a seed layer and a PbZrTiO3 layer disposed on the seed layer, the seed layer formulated to provide preferential growth structure of the PbZrTiO3 layer.

In some embodiments, the actuating beam extends from the spacing member toward the orifice a distance between 500 and 1,000 microns. In some embodiments, the actuating beam extends from the spacing member toward the orifice a distance of 850 microns.

In some embodiments, the orifice is substantially cylindrical. In some embodiments, the orifice is approximately 60 microns in diameter. In some embodiments, a ratio of a length to a diameter of the orifice is in a range of 1:1 to 15:1. In some embodiments, the sealing member is substantially annular and substantially centered with respect to the orifice, wherein the sealing member has a diameter approximately 1.5 times that of the orifice.

In some embodiments, a jetting assembly comprises: a valve body comprising an orifice plate including a plurality of orifices extending therethrough; a plurality of micro-valves, wherein each of the plurality of micro-valves comprises: a spacing member disposed on the orifice plate on a first side of a corresponding orifice of the plurality of orifices, wherein an edge of the spacing member is spaced from a boundary of a corresponding orifice by a distance in a first direction, a valve seat disposed around the corresponding orifice, wherein the corresponding orifice and an opening defined by the valve seat define a fluid outlet, an actuating beam disposed on the spacing member, the actuating beam extending at least the distance in the first direction from the spacing member such that an overlapping portion thereof overlaps with the fluid outlet, wherein the actuating beam comprises a layer of piezoelectric material and an electrical connection portion, and a sealing member affixed to the overlapping portion, the sealing member extending from the overlapping portion toward the valve seat such that an outer surface thereof contacts the valve seat when the layer of piezoelectric material is in a default state to close the micro-valve; and a fluid manifold coupled to each of the plurality of micro-valves to define at least one fluid plenum, each of the at least one fluid plenum corresponding to at least a portion of the plurality of micro-valves.

In some embodiments, the jetting assembly further comprises an interposer disposed on the fluid manifold, the interposer having a greater rigidity than the orifice plate to prevent bowing of the orifice plate. In some embodiments, a flex circuit is disposed between the fluid manifold and the interposer, the flex circuit including control circuitry electrically connected to the electrical connection portion of the actuating beam of each of the plurality of micro-valves by wire bonds.

In some embodiments, the flex circuit is disposed between the interposer and the fluid manifold and attached to a circuit board, the circuit board extending perpendicularly to the valve body. In some embodiments, the fluid manifold comprises a first opening in fluid communication with each of the fluid outlets of the plurality of micro-valves and a second opening, wherein the wire bonds extend from the flex circuit to the electrical connection portions through the second opening.

In some embodiments, the jetting assembly further comprises an encapsulant disposed in the second opening, wherein the encapsulant covers each of the plurality of electrical connection portions and the plurality of wire bonds. In some embodiments, the plurality of micro-valves are arranged in an evenly distributed row, wherein the first and second openings are substantially parallel to one another. In some embodiments, a surface of the orifice plate opposite to the fluid manifold has a flatness such that the surface bows by no more than 8 microns.

In some embodiments, each of the plurality of actuating beams comprises a non-active portion, a tuning layer, and an actuation portion including the at least one layer of piezoelectric material, wherein the tuning layer has a predetermined tuning stress such that in the closed position, the sealing member contacts and exerts a force on the valve seat so as to fluidly seal the orifice. In some embodiments, each of the plurality of spacing members is equivalent in thickness to a corresponding sealing member. In some embodiments, each of the tuning layers is composed of at least one of silicon dioxide or silicon nitride. In some embodiments, each of the non-active portions, the spacing members, and the sealing members are formed from the same material. In some embodiments, the material comprises silicon.

In some embodiments, each of the actuation portions comprises electrode portions sandwiching the at least one layer of piezoelectric material, wherein each electrode portion comprises a conductive layer disposed. In some embodiments, each of the plurality of actuation portions further comprises a passivation structure disposed on exposed portions of both of the electrode portions and the layer of piezoelectric material, the passivation structure covering the entirety of a top electrode to prevent fluid from reaching the top electrode.

In some embodiments, a micro-valve for use in a jetting assembly comprises: an orifice plate including a first surface and a second surface, the orifice plate comprising an orifice extending from the first surface to the second surface; a spacing member disposed on the first surface, the spacing member offset from the orifice; an actuating beam disposed on the spacing member, wherein the actuating beam extends from the spacing member toward the orifice, wherein the actuating beam comprises a layer of piezoelectric material, the actuating beam movable between a closed position and an open position by applying an electrical signal to the layer of piezoelectric material; and a sealing member affixed to an end portion of the actuating beam; wherein, when the layer of piezoelectric material does not have an electrical signal applied thereto, the actuating beam is in the closed position and a sealing surface of the sealing member contacts a rim of the orifice to close the micro-valve.

In some embodiments, the spacing member and the sealing member have substantially the same thickness. In some embodiments, the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the orifice so as to fluidly seal the orifice.

In some embodiments, in the absence of the electrical signal, the predetermined turning stress is configured to cause the actuating beam to curve towards the orifice such that the sealing surface would be positioned a predetermined distance beneath a lower surface of the spacing member. In some embodiments, in response to application of the electrical signal, the actuating beam bends away from the orifice such that a portion of the sealing surface is positioned greater than 7 microns above the orifice such that the micro-valve is open. In some embodiments, the tuning layer is composed of at least one of silicon dioxide or silicon nitride. In some embodiments, each of the non-active portion, the spacing member, and the sealing member are formed from the same material.

As used herein, the terms "about" and "approximately" generally mean plus or minus 10% of the stated value. For example, about 0.5 would include 0.45 and 0.55, about 10 would include 9 to 11, about 1000 would include 900 to 1100.

As utilized herein, the terms "substantially' and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise arrangements and/or numerical ranges provided. Accordingly, these terms should be interpreted as indicating that insubstantial or inconsequential modifications or alterations of the subject matter described and claimed are considered to be within the scope of the inventions as recited in the appended claims.

The terms "coupled," "connected," and the like, as used herein, mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the figures. It should be noted that the orientation of various elements may differ according to other exemplary embodiments, and that such variations are intended to be encompassed by the present disclosure.

The construction and arrangement of the elements as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements, the position of elements may be reversed or otherwise varied, and the nature or number of discrete elements or positions may be altered or varied.

Additionally, the word "exemplary" is used to mean serving as an example, instance, or illustration. Any embodiment or design described herein as "exemplary" or as an "example" is not necessarily to be construed as preferred or advantageous over other embodiments or designs (and such term is not intended to connote that such embodiments are necessarily extraordinary or superlative examples). Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

Other substitutions, modifications, changes and omissions may also be made in the design, operating conditions and arrangement of the various exemplary embodiments without departing from the scope of the present invention. For example, any element disclosed in one embodiment may be incorporated or utilized with any other embodiment disclosed herein. Also, for example, the order or sequence of any process or method steps may be varied or re-sequenced according to alternative embodiments. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the scope of the appended claims.

What is claimed is:

1. A micro-valve comprising:
   a fluid channel comprising:
      a septum positioned at an inlet of the fluid channel; and
      a filter positioned at the outlet of the fluid channel;
   an orifice plate including a first surface and a second surface, the orifice plate comprising an orifice extending from the first surface to the second surface;
   a spacing member disposed on the first surface, the spacing member offset from the orifice;
   a valve seat disposed on the first surface, wherein the valve seat defines an opening in fluid communication with the orifice and a fluid plenum;
   an actuating beam disposed on the spacing member, wherein the actuating beam extends from the spacing member toward the orifice, wherein the actuating beam comprises a layer of piezoelectric material, the actuating beam movable between a closed position and an open position by applying an electrical signal to the layer of piezoelectric material; and a sealing member affixed to an end portion of the actuating beam;

wherein, when the layer of piezoelectric material does not have an electrical signal applied thereto, the actuating beam is in the closed position, a sealing surface of the sealing member contacts the valve seat to close the micro-valve.

2. The micro-valve of claim 1, wherein the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the valve seat so as to fluidly seal the orifice.

3. The micro-valve of claim 2, wherein the spacing member and the sealing member have substantially the same thickness.

4. The micro-valve of claim 3, wherein in the absence of the electrical signal, the predetermined tuning stress is configured to cause the actuating beam to curve towards the orifice such that in the absence of the valve seat, the sealing surface would be positioned a predetermined distance beneath a lower surface of the spacing member.

5. The micro-valve of claim 3, wherein the actuation portion comprises two electrode portions, one located on a first side and the other located on an opposite side of the layer of piezoelectric material, and wherein each electrode portion comprise a conductive layer.

6. The micro-valve of claim 5, wherein the actuating beam further comprises a passivation structure disposed on at least one of the electrode portions.

7. The micro-valve of claim 6, wherein the passivation structure comprises an aluminum oxide layer, a silicon dioxide layer disposed on the aluminum oxide layer, and a silicon nitride layer disposed on the silicon dioxide layer.

8. The micro-valve of claim 1, wherein the at least one layer of piezoelectric material comprises a seed layer and a PbZrTiO3 layer disposed on the seed layer, the seed layer formulated to provide preferential growth structure of the PbZrTiO3 layer.

9. A jetting assembly comprising:
a valve body comprising an orifice plate including a plurality of orifices extending therethrough;
a plurality of micro-valves, wherein each of the plurality of micro-valves comprises:
a fluid channel comprising:
  a septum positioned at an inlet of the fluid channel; and
  a filter positioned at the outlet of the fluid channel;
a spacing member disposed on the orifice plate on a first side of a corresponding orifice of the plurality of orifices, wherein an edge of the spacing member is spaced from a boundary of a corresponding orifice by a distance in a first direction,
a valve seat disposed around the corresponding orifice, wherein the corresponding orifice and an opening defined by the valve seat define a fluid outlet,
an actuating beam disposed on the spacing member, the actuating beam extending at least the distance in the first direction from the spacing member such that an overlapping portion thereof overlaps with the fluid outlet, wherein the actuating beam comprises a layer of piezoelectric material and an electrical connection portion, and a sealing member affixed to the overlapping portion, the sealing member extending from the overlapping portion toward the valve seat such that an outer surface thereof contacts the valve seat when the layer of piezoelectric material is in a default state to close the micro-valve; and a fluid manifold coupled to each of the plurality of micro-valves to define at least one fluid plenum, each of the at least one fluid plenum corresponding to at least a portion of the plurality of micro-valves.

10. The jetting assembly of claim 9, further comprising an interposer disposed on the fluid manifold, the interposer having a greater rigidity than the orifice plate to prevent bowing of the orifice plate.

11. The jetting assembly of claim 10, further comprising:
a flex circuit disposed between the fluid manifold and the interposer, the flex circuit including control circuitry electrically connected to the electrical connection portion of the actuating beam of each of the plurality of micro-valves.

12. The jetting assembly of claim 11, wherein the flex circuit is disposed between the interposer and the fluid manifold and attached to a circuit board, the circuit board extending perpendicularly to the valve body.

13. The jetting assembly of claim 11, wherein the fluid manifold comprises a first opening in fluid communication with each of the fluid outlets of the plurality of micro-valves and a second opening, wherein the wire bonds extend from the flex circuit to the electrical connection portions through the second opening.

14. The jetting assembly of claim 9, wherein each of the plurality of actuating beams comprises a non-active portion, a tuning layer, and an actuation portion including the at least one layer of piezoelectric material, wherein the tuning layer has a predetermined tuning stress such that in the closed position, the sealing member contacts and exerts a force on the valve seat so as to fluidly seal the orifice.

15. The jetting assembly of claim 14, wherein each of the plurality of spacing members is equivalent in thickness to a corresponding sealing member.

16. The jetting assembly of claim 14, wherein each of the actuation portions comprises electrode portions sandwiching the at least one layer of piezoelectric material, wherein each electrode portion comprises a conductive layer.

17. The jetting assembly of claim 16, wherein each of the plurality of actuation portions further comprises a passivation structure disposed on exposed portions of both of the electrode portions and the layer of piezoelectric material, the passivation structure covering the entirety of a top electrode to prevent fluid from reaching the top electrode.

18. A micro-valve for use in a jetting assembly, comprising:
a fluid channel comprising:
  a septum positioned at an inlet of the fluid channel; and
  a filter positioned at the outlet of the fluid channel;
an orifice plate including a first surface and a second surface, the orifice plate comprising an orifice extending from the first surface to the second surface;
a spacing member disposed on the first surface, the spacing member offset from the orifice;
an actuating beam disposed on the spacing member, wherein the actuating beam extends from the spacing member toward the orifice, wherein the actuating beam comprises a layer of piezoelectric material, the actuating beam movable between a closed position and an open position by applying an electrical signal to the layer of piezoelectric material; and a sealing member affixed to an end portion of the actuating beam;

wherein, when the layer of piezoelectric material does not have an electrical signal applied thereto, the actuating beam is in the closed position and a sealing surface of the sealing member contacts a rim of the orifice to close the micro-valve.

19. The micro-valve of claim 18, wherein the spacing member and the sealing member have substantially the same thickness.

20. The micro-valve of claim 18, wherein the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the orifice so as to fluidly seal the orifice.

* * * * *